(12) United States Patent
Titarenko

(10) Patent No.: US 10,250,246 B2
(45) Date of Patent: Apr. 2, 2019

(54) PROGRAMMABLE NEUROMORPHIC DEVICE

(71) Applicant: SYNTRON SYSTEMS INC., Brooklyn, NY (US)

(72) Inventor: Aleksandr Titarenko, Brooklyn, NY (US)

(73) Assignee: Syntron Systems Inc., Brooklyn, NY (US)

( * ) Notice: Subject to any disclaimer, the term of this patent is extended or adjusted under 35 U.S.C. 154(b) by 210 days.

(21) Appl. No.: 15/353,353

(22) Filed: Nov. 16, 2016

(65) Prior Publication Data
US 2017/0272065 A1 Sep. 21, 2017

Related U.S. Application Data

(60) Provisional application No. 62/309,764, filed on Mar. 17, 2016.

(51) Int. Cl.
*G06F 7/50* (2006.01)
*H03K 5/24* (2006.01)
*H03K 19/21* (2006.01)

(52) U.S. Cl.
CPC .............. *H03K 5/2472* (2013.01); *G06F 7/50* (2013.01); *H03K 19/21* (2013.01); *G06F 2207/48* (2013.01)

(58) Field of Classification Search
None
See application file for complete search history.

(56) References Cited

U.S. PATENT DOCUMENTS 4,858,147 A * 8/1989 Conwell .................. G06N 3/10
706/19

* cited by examiner

*Primary Examiner* — Michael D. Yaary
(74) *Attorney, Agent, or Firm* — Moritt Hook & Hamroff LLP; Bret P. Shapiro

(57) ABSTRACT

Technologies are generally described for an array of logic elements effective to generate a data signal. A first logic element may include an input circuit, a comparator circuit, and a state machine. The input circuit may receive a first input state signal and a second input state signal from a second logic element and a third logic element, respectively. The input circuit may determine a sum based on the first and second input state signals. The comparator circuit may compare the sum with a threshold and, in response, may generate an intermediate signal based on the comparison. The state machine may identify a current state of the first logic element. The state machine may generate an output state signal based on the intermediate signal and the current state of the first logic element. The output state signal may indicate a subsequent state of the first logic element.

18 Claims, 13 Drawing Sheets

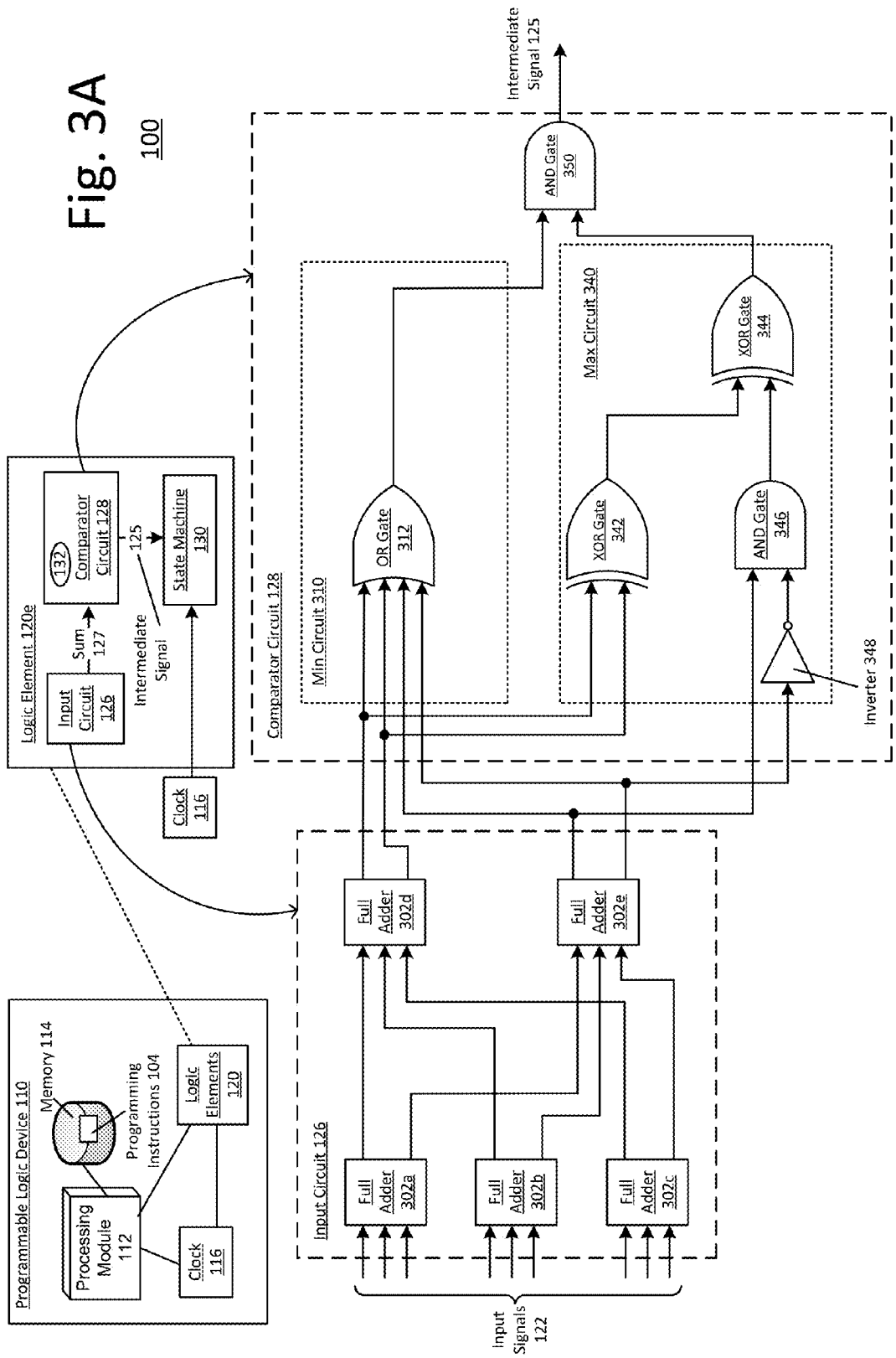

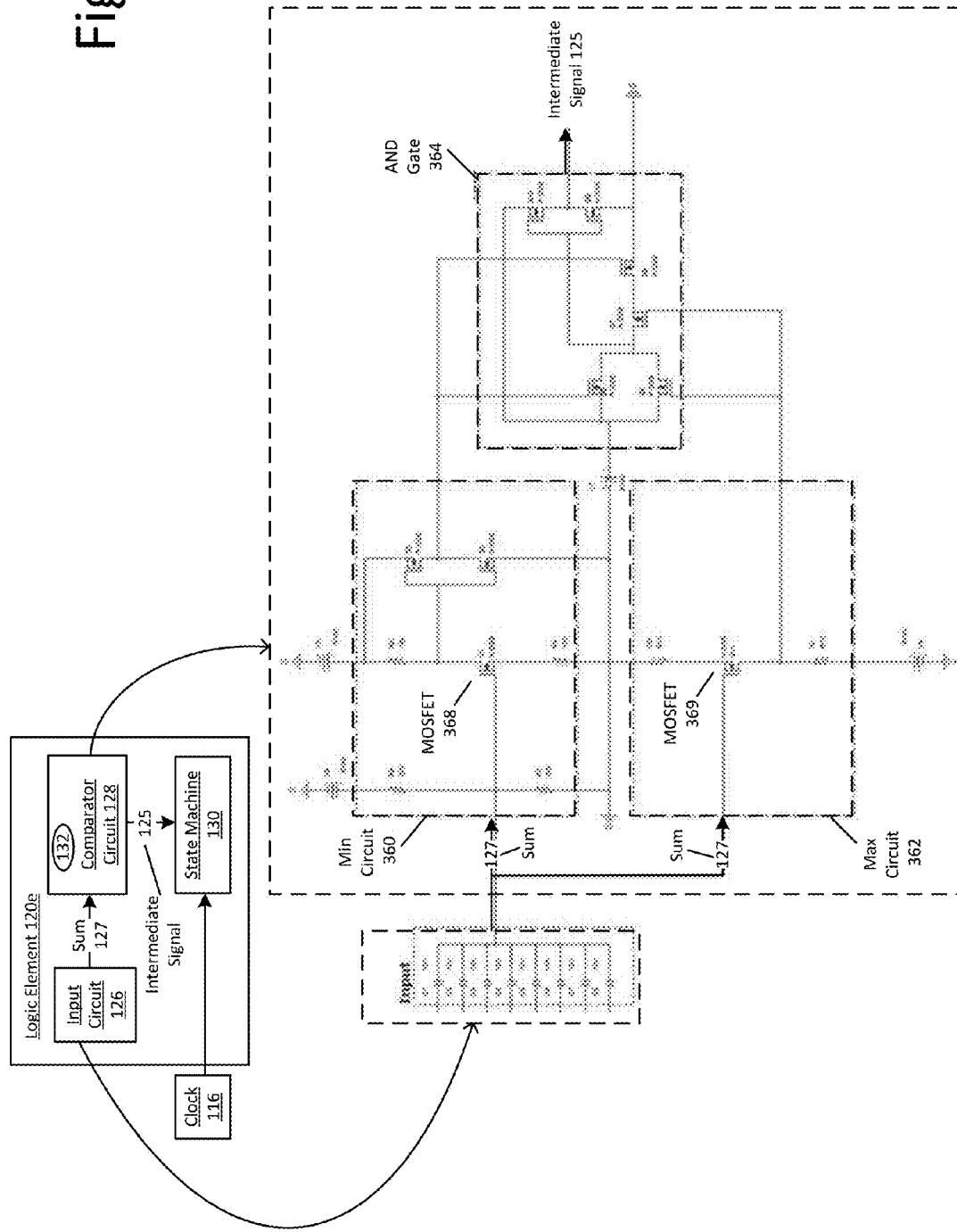

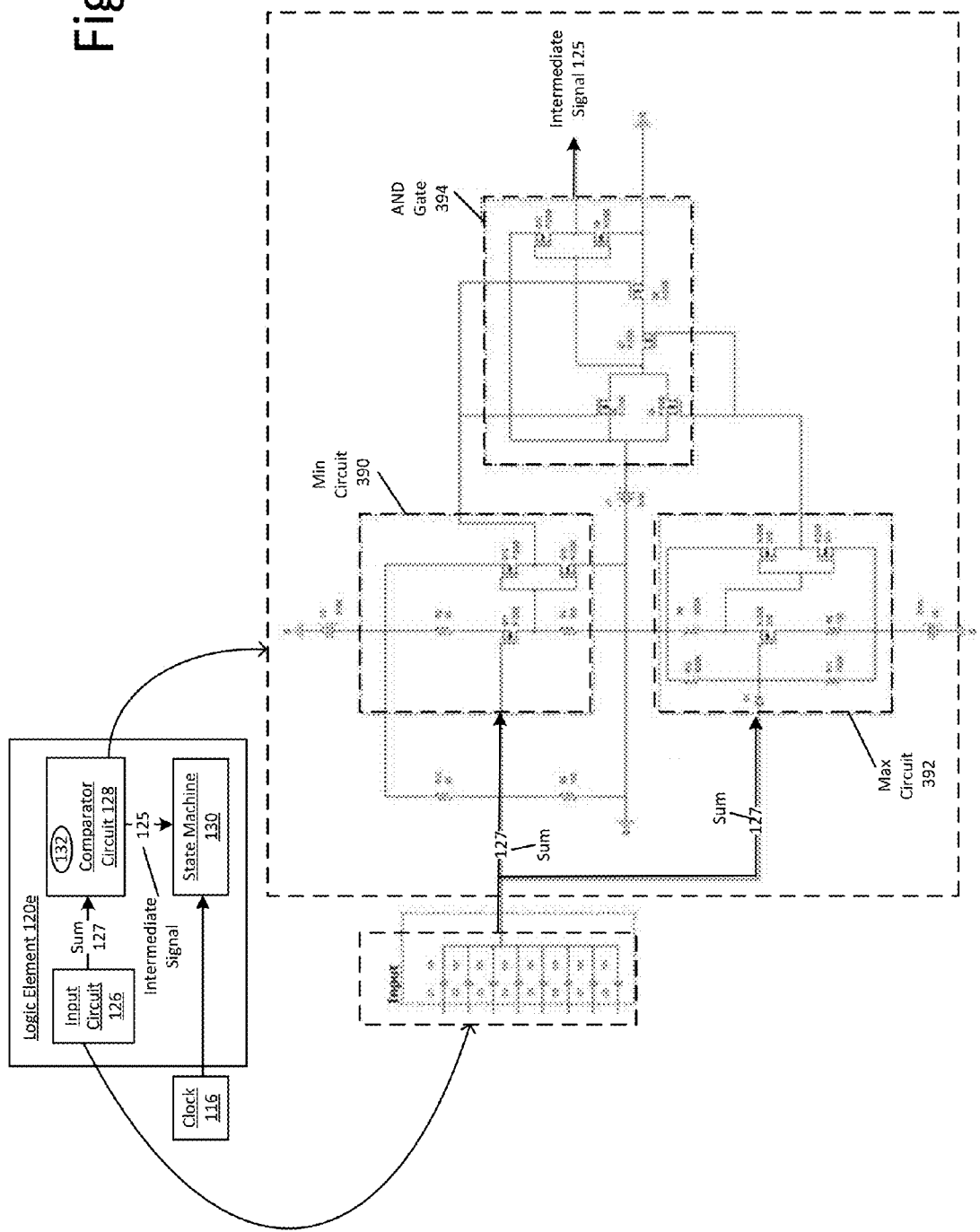

PROGRAMMABLE NEUROMORPHIC DEVICE

CROSS-REFERENCE TO RELATED APPLICATIONS

This application claims priority under 35 U.S.C. § 119(e) to U.S. Provisional Application No. 62/309,764 filed on Mar. 17, 2016. The disclosure of the Provisional Application is hereby incorporated by reference in its entirety.

BACKGROUND

Unless otherwise indicated herein, the materials described in this section are not prior art to the claims in this application and are not admitted to be prior art by inclusion in this section.

A programmable logic device may include one or more programmable logic elements configured to implement and/or simulate electronic components and program functions. Each logic element may include same or different components. When a group of logic elements are implemented, logic outputs may be generated based on logic inputs. Programming instructions may be defined to initiate states of logic elements in order to implement the logic elements as electronic components.

SUMMARY

In some examples, a first logic element in an array effective to generate an output state signal is disclosed. The array may include at least the first logic element, a second logic element configured to be in communication with the first logic element, and a third logic element configured to be in communication with the first logic element. The first logic element may comprise an input circuit. The input circuit may be configured to receive a first input state signal from the second logic element. The input circuit may be configured to receive a second input state signal from the third logic element. The input circuit may be configured to determine a sum based on the first and second input state signals. The first logic element may comprise a comparator circuit. The comparator circuit may be configured to be in communication with the input circuit. The comparator circuit may be configured to receive the sum from the input circuit. The comparator circuit may be configured to compare the sum with a threshold. The comparator circuit may be configured to generate an intermediate signal based on the comparison of the sum with the threshold. The first logic element may comprise a state machine. The state machine may be configured to be in communication with the comparator circuit. The state machine may be configured to identify a current state of the first logic element. The state machine may be configured to receive the intermediate signal from the comparator circuit. The state machine may be configured to generate an output state signal based on the intermediate signal and based on a current state of the first logic element. The output state signal may be effective to indicate a subsequent state of the first logic element.

In some examples, an array is disclosed. The array may comprise at least a first logic element, a second logic element, and a third logic element. The first logic element, second logic element, and third logic element may be configured to be in communication with each other. At a first clock phase, the first logic element may be configured to receive a first input state signal from the second logic element. At the first clock phase, the first logic element may be configured to receive a second input state signal from the third logic element. At the first clock phase, the first logic element may be configured to determine a first sum based on the first and second input state signals. At the first clock phase, the first logic element may be configured to compare the first sum with a threshold. At the first clock phase, the first logic element may be configured to generate a first output state signal based on the comparison of the first sum with the threshold, and based on a current state of the first logic element. The first output state signal may be effective to indicate a subsequent state of the first logic element. At the first clock phase, the first logic element may be configured to send the first output state signal to the second logic element and to the third logic element. At a second clock phase, the second logic element may be configured to receive the first output state signal from the first logic element. At the second clock phase, the second logic element may be configured to receive a third input state signal from the third logic element. At the second clock phase, the second logic element may be configured to determine a second sum based on the first output state signal and based on the third input state signal. At the second clock phase, the second logic element may be configured to compare the second sum with the threshold. At the second clock phase, the second logic element may be configured to generate a second output state signal based on the comparison of the second sum with the threshold, and based on a current state of the second logic element. The second output state signal may be effective to indicate a subsequent state of the second logic element. At the second clock phase, the second logic element may be configured to send the second output state signal to the first logic element and to the third logic element. At a third clock phase, the third logic element may be configured to receive a fourth input state signal from the first logic element. At the third clock phase, the third logic element may be configured to receive the second output state signal from the second logic element. At the third clock phase, the third logic element may be configured to determine a third sum based on the fourth input state signal and based on the second output state signal. At the third clock phase, the third logic element may be configured to compare the third sum with a threshold. At the third clock phase, the third logic element may be configured to generate a third output state signal based on the comparison of the third sum with the threshold, and based on a current state of the third logic element. The third output state signal may be effective to indicate a subsequent state of the third logic element. At the third clock phase, the third logic element may be configured to send the third output state signal to the first logic element and to the second logic element.

In some examples, methods for generating an output state signal in an array are disclosed. The array may include at least a first logic element, a second logic element configured to be in communication with the first logic element, and a third logic element configured to be in communication with the first logic element. The methods may comprise receiving, by the first logic element at a first clock phase, a first input state signal from the second logic element. The methods may comprise receiving, by the first logic element at the first clock phase, a second input state signal from the third logic element. The methods may comprise determining, by the first logic element at the first clock phase, a first sum based on the first and second input state signals. The methods may comprise comparing, by the first logic element at the first clock phase, the first sum with a threshold. The methods may comprise generating, by the first logic element at the first clock phase, a first output state signal based on the comparison of the first sum with the threshold, and based on a current state of the first logic element. The first output state signal may be effective to indicate a subsequent state of the first logic element. The methods may comprise sending, by the first logic element at the first clock phase, the first output state signal to the second logic element and to the third logic element. The methods may comprise receiving, by the second logic element at a second clock phase, the first output state signal from the first logic element. The methods may comprise receiving, by the second logic element at the second clock phase, a third input state signal from the third logic element. The methods may comprise determining, by the second logic element at the second clock phase, a second sum based on the first output state signal and based on the third input state signal. The methods may comprise comparing, by the second logic element at the second clock phase, the second sum with a threshold. The methods may comprise generating, by the second logic element at the second clock phase, a second output state signal based on the comparison of the second sum with the threshold, and based on a current state of the second logic element. The second output state signal may be effective to indicate a subsequent state of the second logic element. The methods may comprise sending, by the second logic element at the second clock phase, the second output state signal to the first logic element and to the third logic element. The methods may comprise receiving, by the third logic element at a third clock phase, a fourth input state signal from the first logic element. The methods may comprise receiving, by the third logic element at the third clock phase, the second output state signal from the second logic element. The methods may comprise determining, by the third logic element at the third clock phase, a third sum based on the fourth input state signal and based on the second output state signal. The methods may comprise comparing, by the third logic element at the third clock phase, the third sum with a threshold. The methods may comprise generating, by the third logic element at the third clock phase, a third output state signal based on the comparison of the third sum with the threshold, and based on a current state of the third logic element. The third output state signal may be effective to indicate a subsequent state of the third logic element. The methods may comprise sending, by the third logic element at the third clock phase, the third output state signal to the first logic element and to the second logic element.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 3A illustrates example system of FIG. 1 with additional detail relating to a comparator circuit of a logic element;

FIG. 3B illustrates example system of FIG. 1 with additional detail relating to a comparator circuit of a logic element;

FIG. 3E illustrates example system of FIG. 1 with additional detail relating to a comparator circuit of a logic element;

DETAILED DESCRIPTION

Figure 1:
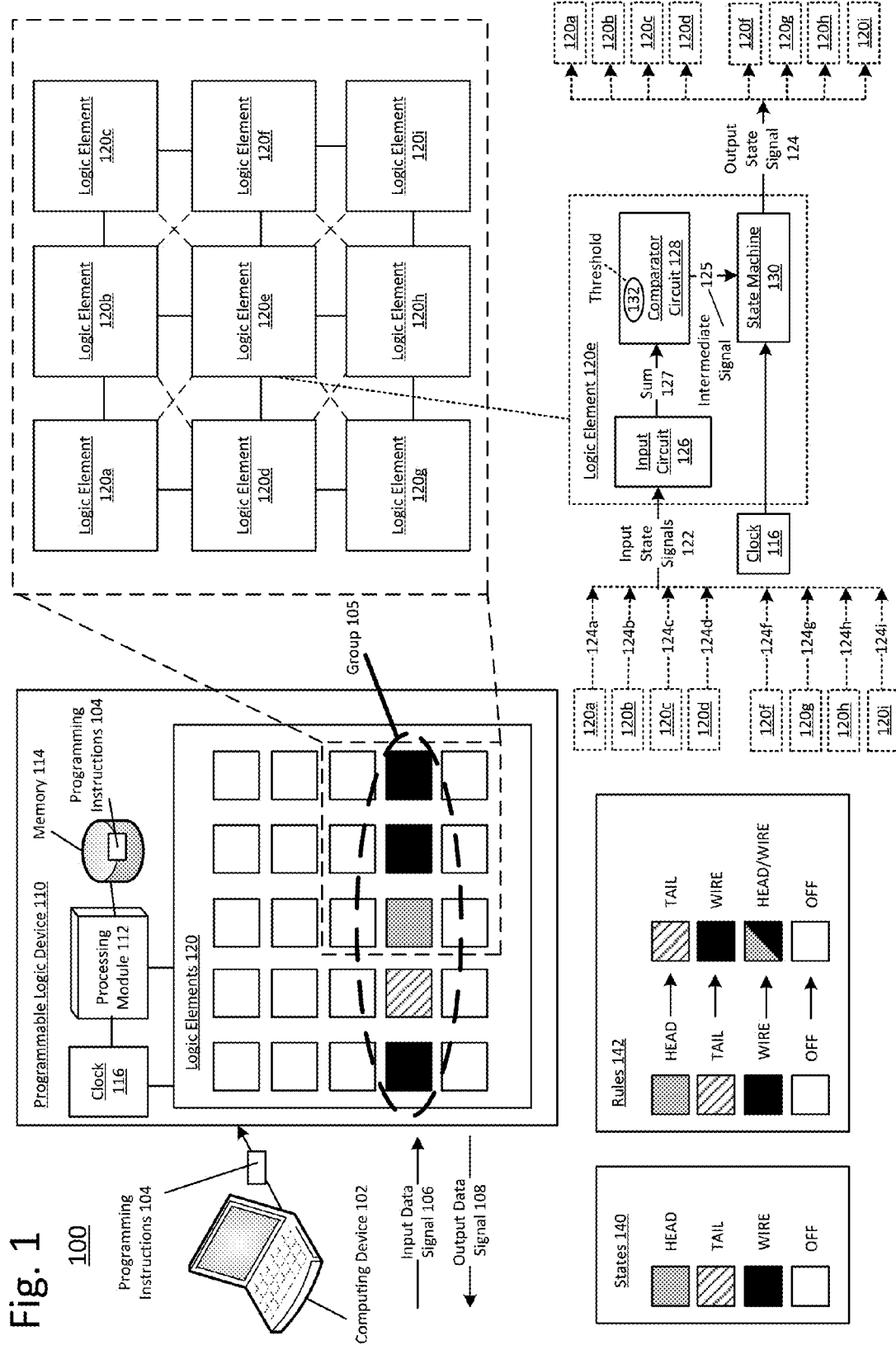
FIG. 1 illustrates an example system that can be utilized to implement a programmable logic device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 illustrates an example system 100 that can be utilized to implement a programmable logic device, arranged in accordance with at least some embodiments described herein. System 100 may include a computing device 102 and/or a programmable logic device 110 configured to be in communication with each other. In some examples, computing device 102 may be controlled by a user. In some examples, computing device 102 may be a desktop computer, a laptop computer, a tablet device, etc. Computing device 102 may be configured to generate programming instructions 104, where programming instructions 104 may be effective to program or configure programmable logic device 110. In some examples, programming instructions 104 may be effective to program one or more components, tiles, cells, blocks, logic elements, interconnects, etc., such that states of gates, transistors, blocks, cells, and/or logic elements, etc., within programmable logic device 110 may be defined based on programming instructions 104. Computing device 102 may send programming instructions 104 to programmable logic device 110 in order to program programmable logic device 110. In some examples, computing device 102 may send programming instructions 104 to programmable logic device 110 through a programmer device configured to be in communication with computing device 102 and programmable logic device 110.

Programmable logic device 110 may include a processing module 112, a memory 114, a clock 116, and/or one or more tiles, where each tile may include a logic element 120, configured to be in communication with each other. Tiles in programmable logic device 110 may be arranged in an array as shown in FIG. 1. Processing module 112 may be a processor, a microprocessor, a microcontroller, etc. In some examples, processing module 112 may be configured to execute programming instructions 104 to define initial states of logic elements 120, and to control state changes of logic elements 120 (described below). Memory 114 may be configured to store programming instructions 104. Processing module 112 may be further configured to control clock 116, where a clock rate of clock 116 may be defined by programming instructions 104.

When programmable logic device 110 includes two or more logic elements 120, logic elements 120 may be connected to each other. Focusing on a particular set of logic elements including logic elements 120a, 120b, 120c, 120d, 120e, 120f, 120g, 120h, 120i, logic elements 120 may be connected to each other, such that logic elements 120a, 120b, 120c, 120d, 120f, 120g, 120h, 120i are connected neighbor logic elements of logic element 120e. In an example, logic element 120d may be connected to logic element 120e such that an output of logic element 120d may be connected to an input of logic element 120e. In an example, logic element 120d may be connected to logic element 120e such that an output of logic element 120e may be connected to an input of logic element 120d. In some examples, a first logic element may be connected to a second logic element through a third logic element such that the first logic element is connected to the second logic element diagonally. For example, logic element 120b may be connected to 120d through logic element 120e such that an output of logic element 120b may be connected to an input of logic element 120d, where at least a part of a wire connecting logic elements 120b, 120d may be located within logic element 120e. In some examples, logic elements 120 may be identical to each other.

Programming instructions 104 may program a particular group of logic elements 120, such as a group 105, to be implemented as an electronic component such as an AND gate, an OR gate, a NOT gate, a diode, a transistor, etc. Group 105 may be effective to receive an input data signal 106 and may be effective to transmit state signals (state signals will be further described below) among logic elements 120 of group 105 to generate an output data signal 108. Input data signal 106 and output data signal 108 may each include one or more signals of a particular waveform, etc. For example, if group 105 is to be implemented as a two input OR gate, group 105 may receive two input data signals 106 and may generate output data signal 108, where output data signal 108 may be a result of an OR operation performed on the two input data signals 106. Logic elements 120 among group 105 may generate respective output state signals 124 (described below) in order to generate output data signal 108, such that group 105 may be implemented as an electronic component.

Each logic element 120 may be effective to receive input state signals 122, where input state signals 122 may include output state signals 124 generated by one or more neighbor logic elements 120 (described below). In the example shown in FIG. 1, each logic element 120, such as a logic element 120e, may be connected to eight neighbor logic elements in same rows, columns, and/or diagonally, such that input state signals 122 may include eight output state signals 124 generated by the eight neighbor logic elements. As will be described in more detail below, in some examples, each logic element may be connected to an arbitrary number of neighbor logic elements based on an arrangement of logic elements 120 within programmable logic device 110.

Each logic element 120 may include an input circuit 126, a comparator circuit 128, and/or a state machine 130. Input circuit 126 may be configured to receive input state signals 122 and, in response, generate a sum 127 (described below). Input circuit 126 may send sum 127 to comparator circuit 128. Comparator circuit 128 may be configured to receive sum 127 and, in response, may generate an intermediate signal 125 (described below). Comparator circuit 128 may send intermediate signal 125 to state machine 130. State machine 130 may be configured to receive intermediate signal 125 and, in response, may generate output state signal 124 (described below).

Each logic element 120 may be associated with a state 140, where state 140 may be represented by output state signal 124. In the example shown in FIG. 1, there may be a finite number of states 140, such as "HEAD", "TAIL", "WIRE", and "OFF" states. In the example, state 140 of logic element 120d is "HEAD", state 140 of logic element 120e is "WIRE", state 140 of logic element 120f is "WIRE". When state 140 of a particular logic element is "OFF", the particular logic element may not be programmed to be a part of group 105, and may not receive input state signal 122. When state 140 of a particular logic element is "HEAD" or "TAIL", the particular logic element may indicate a direction of input data signal 106 among logic elements 120 of group 105. For example, input data signal 106 may be represented by a first logic element of a "HEAD" state and a second logic element of a "TAIL" state, such that a direction of input data signal 106 may be defined and such that input data signal 106 may be restricted from travelling backwards among group 105. In some examples, input data signal 106 may be represented by at least three logic elements 120. When input data signal 106 is represented by three logic elements 120, the three logic elements may be ordered as "HEAD", "TAIL", "WIRE" such that a subsequent input data signal being input into group 105 serially may not overlap with input data signal 106. When state 140 of a particular logic element is "WIRE", the particular logic element may accept input state signals 122 and may generate output state signal 124 in response to receipt of input state signals 122.

Focusing on logic element 120e as an example, logic element 120e may be effective to receive input state signal 122 from one or more neighbor logic elements 120a, 120b, 120c, 120d, 120f, 120g, 120h, 120i, where input state signals 122 may include output state signals 124a, 124b, 124c, 124d, 124f, 124g, 124h, 124i. Input circuit 126 may be configured to receive input state signals 122, and may be configured to determine sum 127, where sum 127 may indicate a number of input state signals 122 of a particular state. For example, input circuit 126 may be configured to count a number of high inputs present among input state signals 122 in order to generate sum 127, where a high input may be a non-zero voltage carried by an input state signal 122, and a high input may represent a "HEAD" state. Input circuit 126 may send sum 127 to comparator circuit 128. In some examples, programming instructions 104 may define a particular state to be counted by input circuit 126. For example, programming instructions 104 may include instructions for input circuit 126 to count a number of "HEAD" states present among input state signals 122.

Comparator circuit 128 may receive sum 127 from input circuit 126, and in response, may compare sum 127 with a threshold 132, where threshold 132 may be defined by programming instructions 104 (described below). Comparator circuit 128 may generate intermediate signal 125 based on the comparison of sum 127 with threshold 132. Intermediate signal 125 may be a signal effective to indicate whether the comparison of sum 127 with threshold 132 satisfies a condition defined by programming instructions 104 (described below). Comparator circuit 128 may send intermediate signal 125 to state machine 130.

State machine 130 may receive intermediate signal 125 and in response, may generate output state signal 124 based on intermediate signal 125 and a set of rules 142 (described below). In some examples, rules 142 may be defined by programming instructions 104, where rules 142 may indicate a defined set of rules to change a state 140 of a logic element 120 in response to receiving input state signals 122. In some examples, rules 142 may be defined based on circuitry within logic element 120, such as a number, and/or an arrangement, of transistors and/or gates within input circuit 126, comparator circuit 128, and/or state machine 130, etc. In some examples, rules 142 may be defined based on circuitry within logic element 120 and states 140 may be defined by programming instructions 104. In the example shown in FIG. 1, rules 142 may define a set of possible state changes among states 140. Focusing on rules 142, a state of each logic element 120 may change from a "HEAD" state to a "TAIL" state, from a "TAIL" state to a "WIRE" state, from a "WIRE" state to a "HEAD" state, remain unchanged from "WIRE" state, or may remain unchanged from "OFF" state. As will be described in more detail below, state machine 130 may include one or more registers configured to store a current state of logic element 120. State machine 130 may generate output state signal 124 based on the current state stored in the one or more registers, intermediate signal 125, and rules 142. By transmitting output state signal 124 among one or more neighbor logic elements 120 within group 105, group 105 may be implemented as an electronic component as defined by programming instructions 104.

Figure 2:
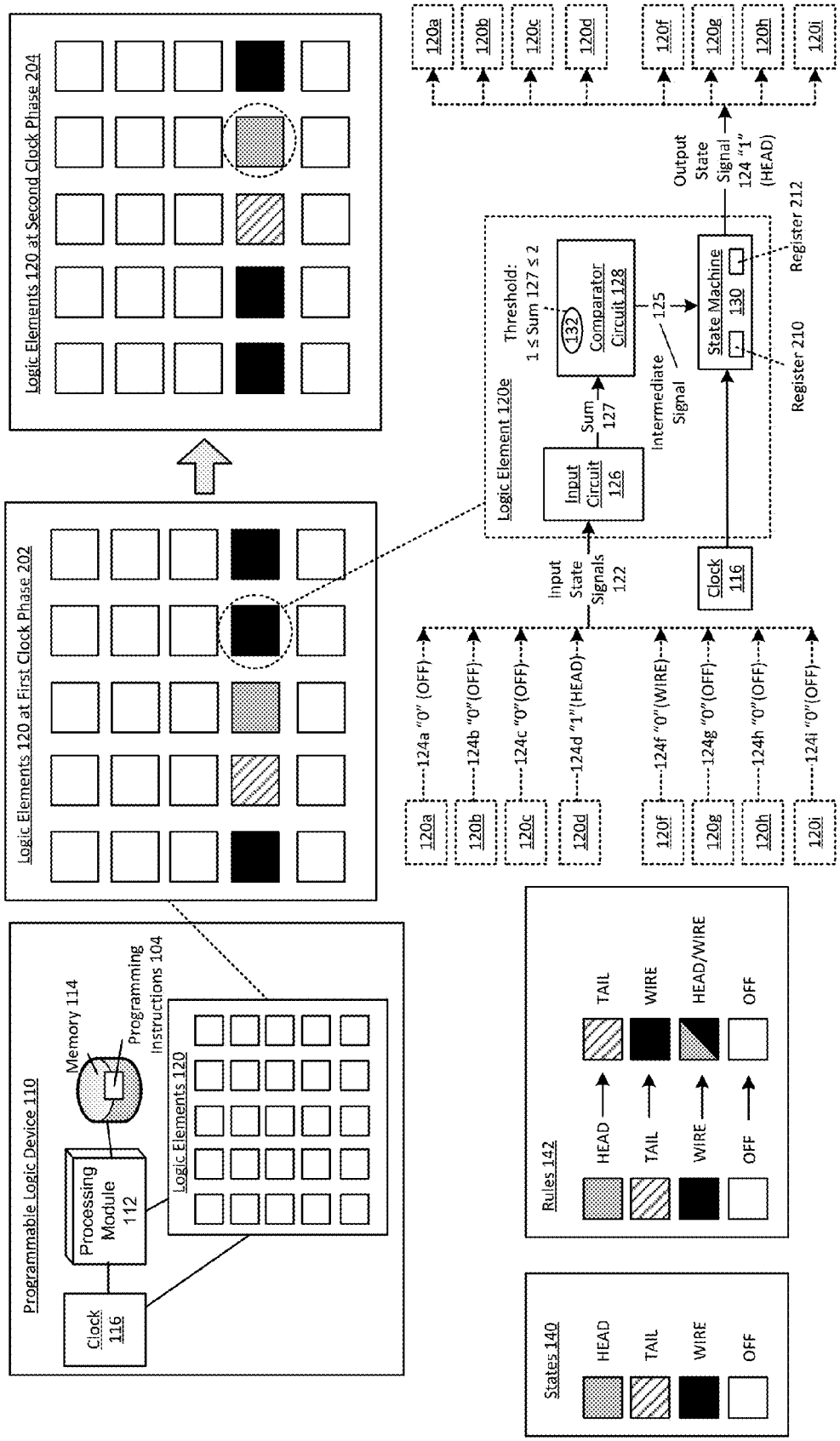
FIG. 2 illustrates example system of FIG. 1 with additional detail relating to implementation of a logic element.

FIG. 2 illustrates example system 100 of FIG. 1 with additional detail relating to implementation of a logic element, arranged in accordance with at least some embodiments described herein. FIG. 2 is substantially similar to system 100 of FIG. 1, with additional details. Those components in FIG. 2 that are labeled identically to components of FIG. 1 will not be described again for the purposes of clarity.

In an example, clock 116 may transition from a first clock phase 202 to a second clock phase 204 and, in response to the transition, state 140 of a logic element 120 may change from a current state to a subsequent state. In the example, first clock phase 202 is a current clock phase and second clock phase 204 is a subsequent clock phase. A current state of logic element 120e, or a state of logic element 120e at first clock phase 202, may be "WIRE". At second clock phase 204, logic element 120e may receive input state signals 122, where input state signals 122 may include output state signals 124a, 124b, 124c, 124d, 124f, 124g, 124h, 124i. Output state signals 124a, 124b, 124c, 124d, 124f, 124g, 124h, 124i may be generated by logic elements 120a, 120b, 120c, 120d, 120f, 120g, 120h, 120i, respectively. Input state signals 122 may be received by input circuit 126. Input circuit 126 may be programmed according to programming instructions 104, such as by processing module 112, to count a number of high inputs present among input state signals 122. In the example, input circuit 126 may count one high inputs (output state signal 124d) among input state signals 122 and, in response, may determine sum 127 to be "1". Input circuit 126 may send sum 127 to comparator circuit 128.

Comparator circuit 128 may be programmed according to programming instructions 104, such as by processing module 112, to compare sum 127 with threshold 132. As mentioned above, threshold 132 may be defined by programming instructions 104. In the example, threshold 132 may be a range bounded by a lower bound value and an upper bound value. For example, threshold 132 may be a range bounded by a lower bound value of "1" and an upper bound value of "2". Comparator circuit 128 may compare sum 127 with threshold 132 to determine if sum 127 is greater than or equal to the lower bound value, and to determine if sum 127 is less than or equal to the upper bound value. In the example, based on the comparisons of sum 127 with threshold 132, comparator circuit 128 may determine that sum 127 ("1") is greater than or equal to the lower bound value ("1") and that sum 127 is less than or equal to the upper bound value ("2"). In response to sum 127 being greater than or equal to the lower bound value and being less than or equal to the upper bound value, comparator circuit may generate intermediate signal 125 to be "1".

In examples where sum 127 is greater than or equal to the lower bound value but not less than nor equal to the upper bound value, comparator circuit 128 may generate intermediate signal 125 to be "0". Similarly, when sum 127 is less than or equal to the upper bound value but not greater than nor equal to the lower bound value, comparator circuit 128 may generate intermediate signal 125 to be "0".

Comparator circuit 128 may send intermediate signal 125 to state machine 130. State machine 130 may include one or more registers, such as a register 210 and a register 212, configured to facilitate generation and output of output state signal 124. In an example, at first clock phase 202, state machine 130 may store a current state of logic element 120 in register 212. In response to receipt of intermediate signal 125, state machine 130 may store a subsequent state of logic element 120 in register 212 to replace the current state of logic element 120 that was previously stored in register 210. As will be described in more detail below, an arrangement and/or connection of register 210 with register 212 may facilitate whether state machine 130 should send output state signal 124 to neighbor logic elements. In some examples, a number of registers, and the arrangement and/or connection of the registers, in state machine 130 may be based on rules 142.

In an example, if a current state of a logic element 120 is "WIRE" and a value of intermediate signal 125 is "0", state machine 130 may generate output state signal 124 to be "0" according to rules 142. In another example, if a current state of a logic element is "HEAD", state machine 130 may generate output state signal 124 to be "0" regardless of whether intermediate signal 125 is "0" or "1" because according to rules 142, a "HEAD" state shall change to a "TAIL" state. In another example, if a previous state of a logic element is "TAIL", state machine 130 may generate output state signal 124 to be "0" because according to rules 142, a "TAIL" state shall change to a "WIRE" state. An output state signal 124 of "0" may be effective to indicate that a current state of logic element 120 is "WIRE", "TAIL", or "OFF". In another example, state machine 130 may include four or more registers, where each register may correspond to one state among states 140. For example, a first register of state machine 130 may correspond to "HEAD" state, a second register of state machine 130 may correspond to "TAIL" state, etc. When a current state of logic element 120 is "HEAD", the first register of state machine 130 may output "1" and the second register of state machine 130 may output "0". State machine 130 may output "1" from the first register as output state signal 124 to indicate that a current state of logic element 120 is "HEAD".

In some examples, state machine 130 may wait for a clock condition to send output state signal 124 to one or more neighbor logic elements. In an example, if programming instructions 104 defines a clock condition to be a positive edge clock condition, at a next positive edge occurrence of clock 116, state machine 130 may transmit output state signal 124 ("HEAD", or "1") to neighbor logic elements 120a, 120b, 120c, 120d, 120f, 120g, 120h, 120i.

FIG. 3A illustrates example system 100 of FIG. 1 with additional detail relating to a comparator circuit of a logic element, arranged in accordance with at least some embodiments described herein. FIG. 3A is substantially similar to system 100 of FIG. 1, with additional details. Those components in FIG. 3A that are labeled identically to components of FIG. 1 will not be described again for the purposes of clarity.

In an example, input circuit 126 and comparator circuit 128 may be implemented with one or more gate level and/or digital integrated circuit components such as adders, AND gates, OR gates, XOR gates, inverters, etc. In the example shown in FIG. 3A, input circuit 126 may include one or more full adders 302 (including 302a, 302b, 302c, 302d, 302e) configured to process input state signals 122 in order to determine sum 127. In some examples, a number of full adders in input circuit 126 may be based on a number of signals included in input state signals 122.

Comparator circuit 128 may include a min circuit 310 and a max circuit 340. Min circuit 310 may be configured to facilitate the comparison of sum 127 with the lower bound value of threshold 132 in order to determine whether sum 127 is greater than or equal to threshold 132. Max circuit 340 may be configured to facilitate the comparison of sum 127 with the upper bound value of threshold 132 in order to determine whether sum 127 is less than or equal to value 134.

In the example, when the lower bound value of threshold 132 is "1", min circuit 310 may combine outputs generated by input circuit 126 in an OR gate 312 to determine if sum 127 is greater than or equal to the lower bound value of threshold 132 ("1"). An output of OR gate 312 may be "1" in response to sum 127 being greater than or equal to the lower bound value of threshold 132 ("1"). If sum 127 is greater than or equal to the lower bound value of threshold 132, OR gate 312 may generate an output of "1". If sum 127 is not greater than or equal to the lower bound value of threshold 132, OR gate 312 may generate an output of "0".

In an example, when the lower and upper bound values of threshold 132 are both "1", input circuit 126 and comparator circuit 128 may be implemented as a single block using a single N-input XOR gate, where N is the total number of inputs to the input circuit 132, or a cascading series of 2-input XOR gates.

In the example, when the upper bound value of threshold 132 is "2", max circuit 340 may implement two XOR gates 342, 344, one AND gate 346, and one inverter 348 to determine a specific number of least or most significant bits of sum 127 in order to determine if sum 127 is less than or equal to the upper bound value of threshold 132 ("2"). If sum 127 is less than or equal to the upper bound value of threshold 132, XOR gate 344 may generate an output of "1". If sum 127 is not less than or equal to the upper bound value of threshold 132, XOR gate 344 may generate an output of "0". When both OR gate 312 and XOR gate 344 outputs "1", AND gate 350 may generate an output of "1". Thus, intermediate signal 125 generated by comparator circuit 128 may be "1". In some examples, the components of input circuit 126 and/or comparator circuit 128 may change based on a number of input state signals 122 into logic element 120, and/or based on threshold 132 defined in programming instructions 104.

FIG. 3B illustrates example system 100 of FIG. 1 with additional detail relating to a comparator circuit of a logic element, arranged in accordance with at least some embodiments described herein. FIG. 3B is substantially similar to system 100 of FIG. 1, with additional details. Those components in FIG. 3B that are labeled identically to components of FIG. 1 will not be described again for the purposes of clarity.

In an example, input circuit 126 may be implemented with one or more capacitors to determine sum 127. In the example shown in FIG. 3B, input circuit 126 may include eight capacitors connected in parallel configuration, where each capacitor may be connected to a respective neighbor logic element 120. When a respective capacitor receives an output state signal 124 from a respective neighbor logic element 120, the respective capacitor may be charged to a respective amount of energy. Input circuit 216 may determine sum 127 based on a combination of the respective amount of energy charged by the capacitors of input circuit 126. In some examples, the capacitance of each capacitor of input circuit 126 may be substantially the same. In some examples, the capacitance of each capacitor may be based on a charge time allowed by a clock cycle length of clock 116 and/or an available silicon footprint of each capacitor. In some examples, a resistor with a relatively large resistance may connect an output node of input circuit 126 and a MOSFET 368 to ground in order to facilitate elimination of a floating node condition, and allowance of charge accumulation and dissipation on the output node of input circuit 126.

Figure 3C:
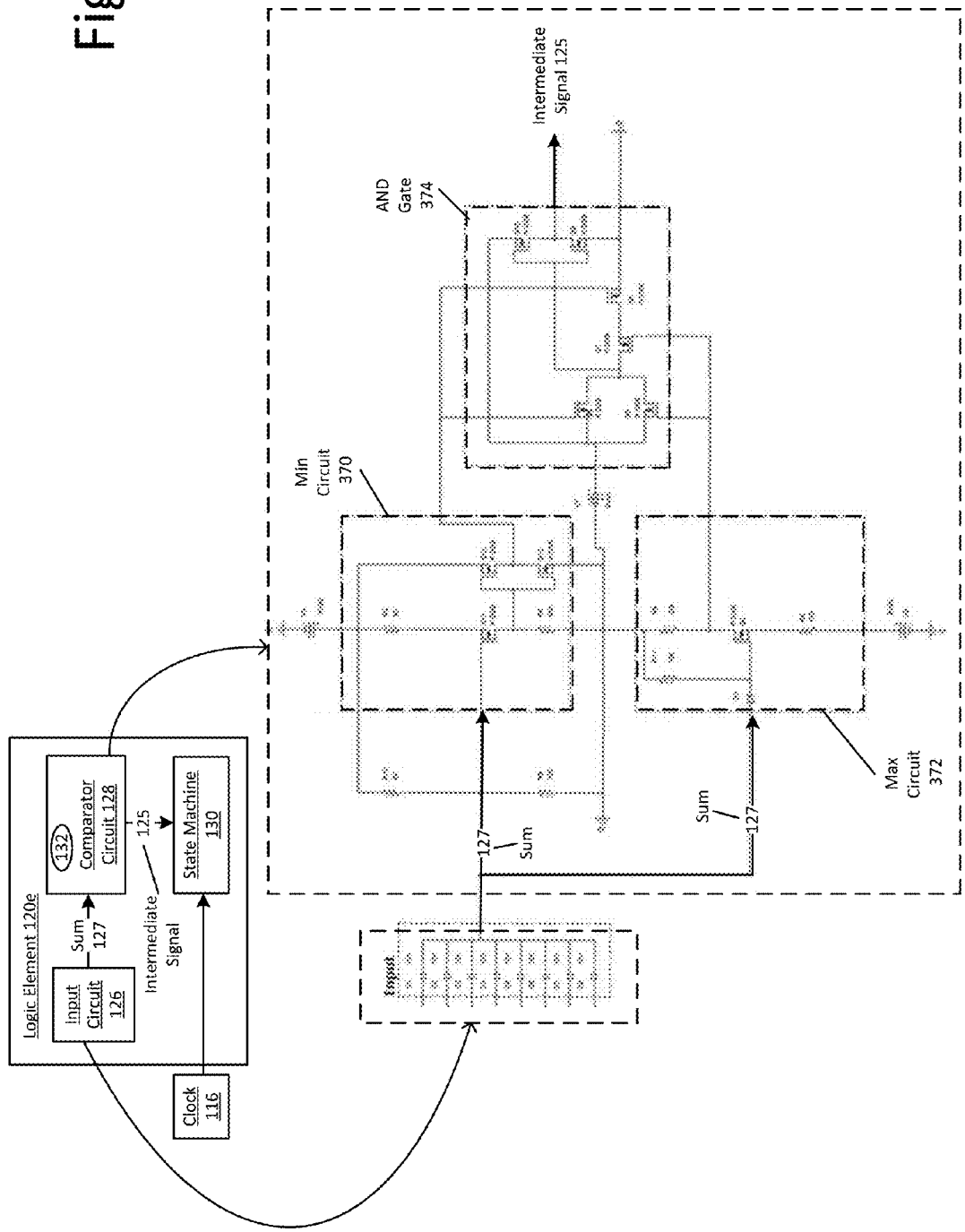
FIG. 3C illustrates example system of FIG. 1 with additional detail relating to a comparator circuit of a logic element.

In an example, input circuit 126 and comparator circuit 128 may be implemented using analog components such as one or more transistors, such as metal-oxide-semiconductor field-effect transistors (MOSFETs), capacitors, resistors, or memristors. In some examples, each MOSFET among comparator circuit 128 may be biased to operate at a specific voltage, as illustrated in FIG. 3B (and FIGS. 3C through 3E described below). Comparator circuit 128 may include a min circuit 360 and a max circuit 362. In the example shown in FIG. 3B, min circuit 360 and max circuit 362 may each include respective sets of P-type MOSFETs and N-type MOSFETS. Min circuit 360 may be configured to facilitate the comparison of sum 127 with threshold 132 in order to determine whether sum 127 is greater than or equal to the lower bound value of threshold 132. Max circuit 362 may be configured to facilitate the comparison of sum 127 with the upper bound value of threshold 132 in order to determine whether sum 127 is less than or equal to the upper bound value of threshold 132.

In the example shown in FIG. 3B, a first potential created between the capacitors of input circuit 126 and MOSFET 368 of min circuit 360 may be proportional to a weighted sum of potentials on each capacitor of input circuit 126. Similarly, a second potential created between the capacitors of input circuit 126 and MOSFET 369 of max circuit 362 may be proportional to the weighted sum of potentials on each capacitor of input circuit 126. When the first and second potentials are proportional to the weighted sum of potentials on each capacitor of input circuit 126, min circuit 360 and/or max circuit 362 may each operate as a voltage window comparator circuit configured to compare sum 127 with threshold 132.

Min circuit 360 may determine if sum 127 is greater than or equal to the lower bound value of threshold 132 ("1"). If sum 127 is greater than or equal to the lower bound value of threshold 132 ("1"), min circuit 360 may generate an output of "1". If sum 127 is not greater than or equal to the lower bound value of threshold 132, min circuit 360 may generate an output of "0".

Max circuit 362 may determine if sum 127 is less than or equal to the upper bound value of threshold 132 ("2"). If sum 127 is less than or equal to the upper bound value of threshold 132 ("2"), max circuit 362 may generate an output of "1". If sum 127 is not less than or equal to the upper bound value of threshold 132, max circuit 362 may generate an output of "0". Outputs of min circuit 360 and 362 may be fed into an AND gate 364 in order for comparator circuit 128 to determine intermediate signal 125.

FIG. 3C illustrates example system 100 of FIG. 1 with additional detail relating to a comparator circuit of a logic element, arranged in accordance with at least some embodiments described herein. FIG. 3C is substantially similar to system 100 of FIG. 1, with additional details. Those components in FIG. 3C that are labeled identically to components of FIG. 1 will not be described again for the purposes of clarity.

In an example shown by FIG. 3C, input circuit 126 may be implemented with one or more capacitors and comparator circuit 128 may be implemented with one or more transistors, such as MOSFETs. In the example shown in FIG. 3C, input circuit 126 may include one or more capacitors connected in parallel configuration, where each capacitor may be effective to receive output state signal 124 from a neighbor logic element 120. Comparator circuit 128 may include a min circuit 370 and a max circuit 372. In the example shown in FIG. 3C, min circuit 370 and max circuit 372 may each include respective sets of P-type MOSFETs and N-type MOSFETs. Min circuit 370 may be configured to facilitate the comparison of sum 127 with threshold 132 in order to determine whether sum 127 is greater than or equal to the lower bound value of threshold 132. Max circuit 372 may be configured to facilitate the comparison of sum 127 with threshold 132 in order to determine whether sum 127 is less than or equal to the upper bound value of threshold 132. Outputs of min circuit 370 and 372 may be fed into an AND gate 374 in order for comparator circuit 128 to determine intermediate signal 125.

Figure 3D:
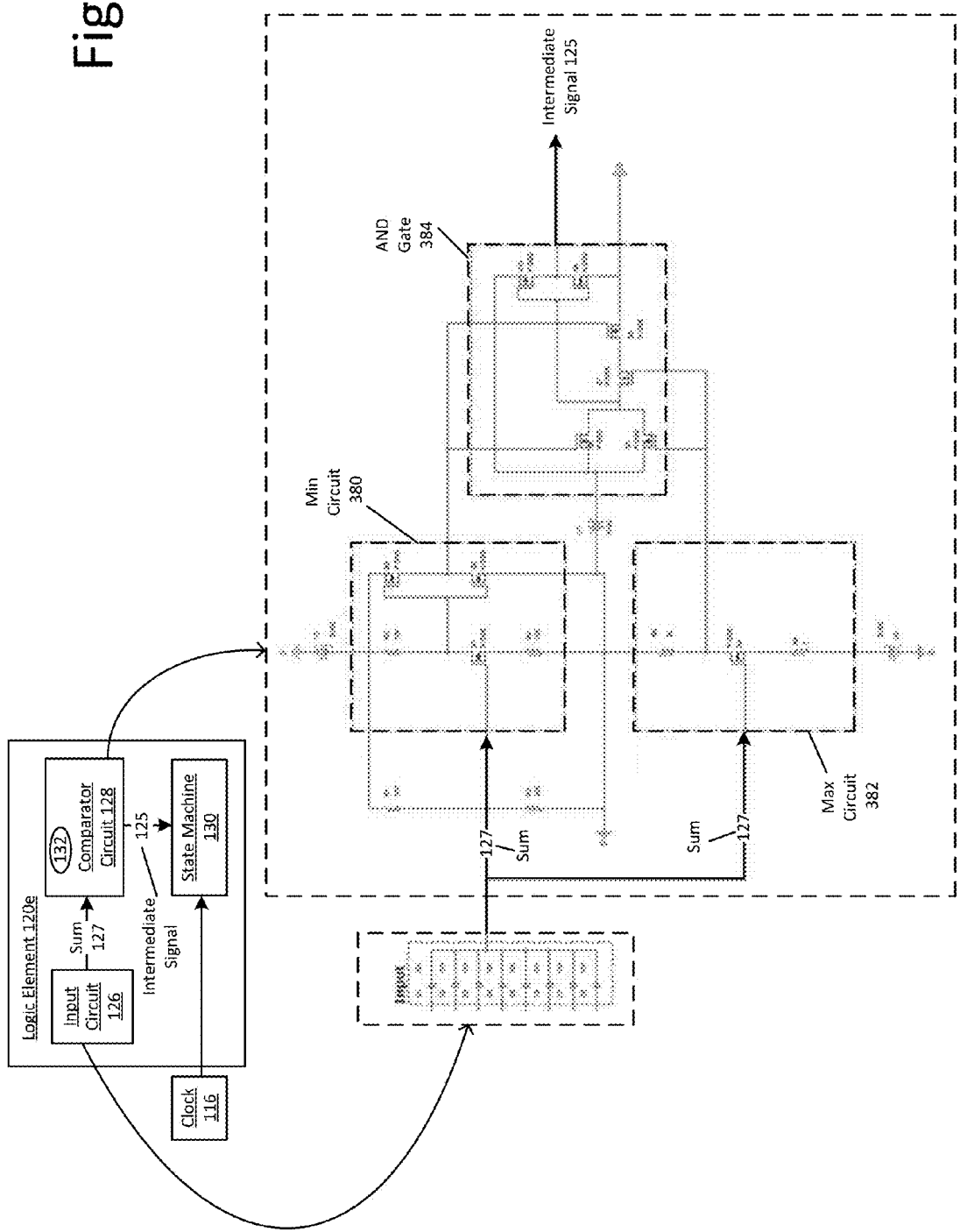
FIG. 3D illustrates example system of FIG. 1 with additional detail relating to a comparator circuit of a logic element.

FIG. 3D illustrates example system 100 of FIG. 1 with additional detail relating to a comparator circuit of a logic element, arranged in accordance with at least some embodiments described herein. FIG. 3D is substantially similar to system 100 of FIG. 1, with additional details. Those components in FIG. 3D that are labeled identically to components of FIG. 1 will not be described again for the purposes of clarity.

In an example shown by FIG. 3D, input circuit 126 may be implemented with one or more capacitors and comparator circuit 128 may be implemented with one or more transistors, such as MOSFETs. In the example shown in FIG. 3D, input circuit 126 may include one or more capacitors connected in parallel configuration, where each capacitor may be effective to receive output state signal 124 from a neighbor logic element 120. Comparator circuit 128 may include a min circuit 380 and a max circuit 382. In the example shown in FIG. 3D, min circuit 380 and max circuit 382 may each include respective sets of P-type MOSFETs and N-type MOSFETs. Min circuit 380 may be configured to facilitate the comparison of sum 127 with threshold 132 in order to determine whether sum 127 is greater than or equal to the lower bound value of threshold 132. Max circuit 382 may be configured to facilitate the comparison of sum 127 with threshold 132 in order to determine whether sum 127 is less than or equal to the upper bound value of threshold 132. Outputs of min circuit 380 and 382 may be fed into an AND gate 384 in order for comparator circuit 128 to determine intermediate signal 125.

FIG. 3E illustrates example system 100 of FIG. 1 with additional detail relating to a comparator circuit of a logic element, arranged in accordance with at least some embodiments described herein. FIG. 3E is substantially similar to system 100 of FIG. 1, with additional details. Those components in FIG. 3E that are labeled identically to components of FIG. 1 will not be described again for the purposes of clarity.

In an example shown by FIG. 3E, input circuit 126 may be implemented with one or more capacitors and comparator circuit 128 may be implemented with one or more transistors, such as MOSFETs. In the example shown in FIG. 3E, input circuit 126 may include one or more capacitors connected in parallel configuration, where each capacitor may be effective to receive output state signal 124 from a neighbor logic element 120. Comparator circuit 128 may include a min circuit 390 and a max circuit 392. In the example shown in FIG. 3E, min circuit 390 and max circuit may each include respective sets of P-type MOSFETs and N-type MOSFETs. Min circuit 390 may be configured to facilitate the comparison of sum 127 with threshold 132 in order to determine whether sum 127 is greater than or equal to the lower bound value of threshold 132. Max circuit 392 may be configured to facilitate the comparison of sum 127 with threshold in order to determine whether sum 127 is less than or equal to the upper bound value of threshold 132. Outputs of min circuit 390 and 392 may be fed into an AND gate 394 in order for comparator circuit 128 to determine intermediate signal 125.

Figure 4:
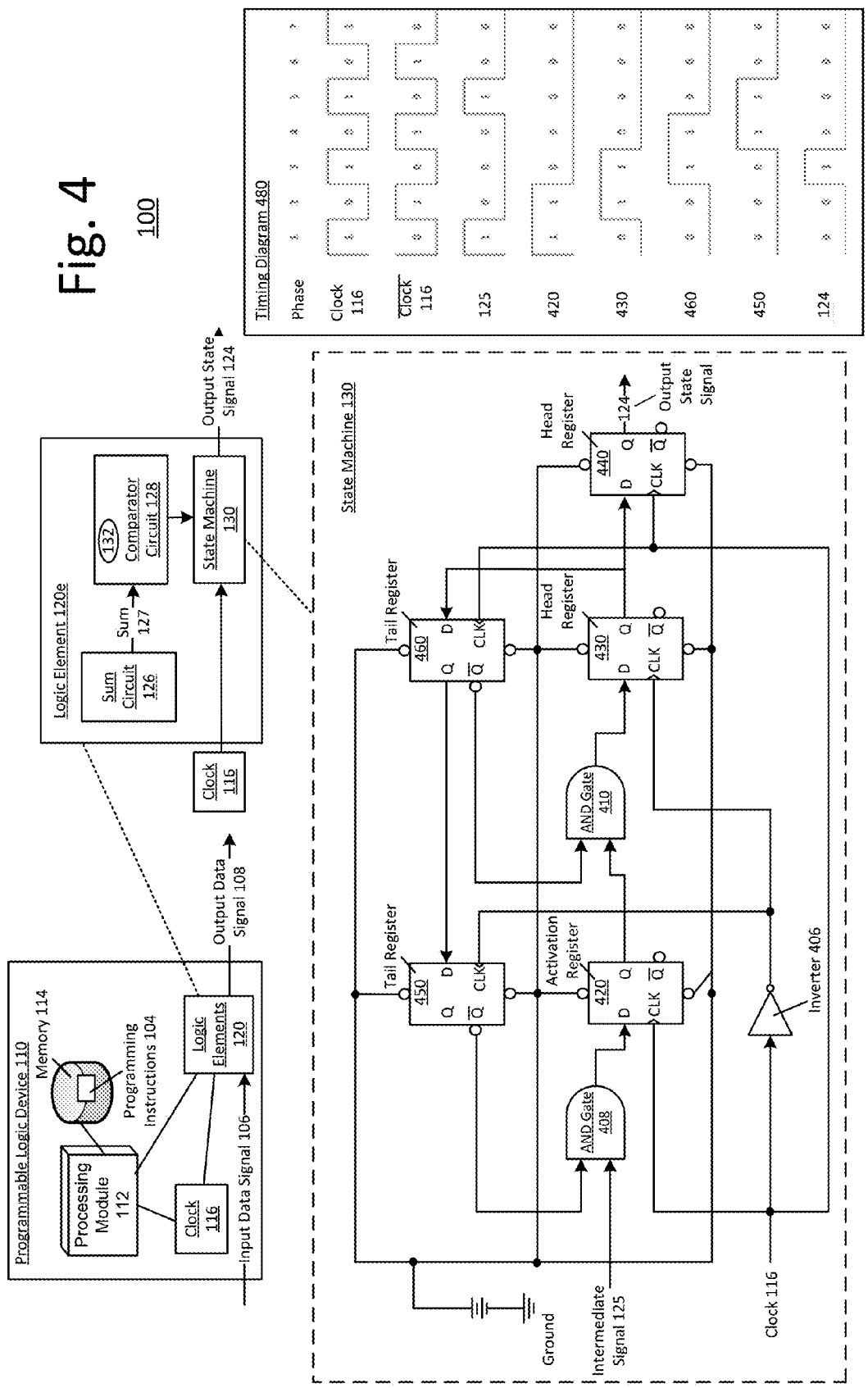
FIG. 4 illustrates example system of FIG. 1 with additional detail relating to a state machine of a logic element.

FIG. 4 illustrates example system 100 of FIG. 1 with additional detail relating to a state machine of a logic element, arranged in accordance with at least some embodiments described herein. FIG. 4 is substantially similar to system 100 of FIG. 1, with additional details. Those components in FIG. 4 that are labeled identically to components of FIG. 1 will not be described again for the purposes of clarity.

In an example shown in FIG. 4, state machine 130 may include one or more components such as an inverter 406, one or more AND gates 408, 410, an activation register 420, a head register 430, a head register 440, a tail register 450, and/or a tail register 460. In some examples, activation register 420, head register 430, head register 440, tail register 450, and/or tail register 460 may each be a D-type flip-flop.

In some examples, activation register 420 may be effective to receive intermediate signal 125 through an AND gate 408. Activation register 420 may be further effective to sync state 140 of logic element 120 to a clock phase of clock 116. Head registers 430, 440 may be effective to drive an output of output state signal 124. An arrangement and/or connection of tail registers 450, 460 relative to activation register 420 and head registers 430, 440 may be effective to block state machine 130 from entering "HEAD" state immediately following a "TAIL" state. State machine 130 may be further configured to determine whether to transmit output state signal to neighbor logic elements 120 based on data stored in activation register 420, head registers 430, 440, and/or tail registers 450, 460.

As shown in the example in FIG. 4, a timing diagram 480 is effective to describe operations that may be performed by each activation register 420, head registers 430, 440, and/or tail register 450, 460 of state machine 130. Timing diagram 480 shows seven clock phases of clock 116. In a first clock phase (labeled Phase 1), the first clock phase is HIGH and intermediate signal 125 may be HIGH, or a "1". As mentioned above, when intermediate signal 125 is HIGH, or "1", a state of logic element 120 may change from "WIRE" to "HEAD". When a clock phase of clock 116 is LOW, such as Phase 2 in timing diagram 480, state machine 130 may be in a reading mode and may not send output state signal 124 to one or more neighbor logic elements 120. As a subsequent HIGH clock phase, such as Phase 3, state machine 130 may send a HIGH output, or output state signal of "1", to one or more neighbor logic elements 120.

For example, state machine 130 may identify data or values stored in head registers 420, 430, and/or tail registers 450, 460. State machine 130 may determine whether to transmit output state signal 124 to neighbor logic elements 120 based on the identified data or values stored in head registers 420, 430, and/or tail registers 450, 460. Activation register 420, head register 430, and tail registers 450, 460 may be arranged to form a shift register. In order to implement rules 142 (shown in FIG. 1), outputs of tail registers 450, 460 may be connected to inputs of AND gates 408, 410, respectively. The outputs of registers 450, 460 may prevent state machine 130 from performing an uptake of intermediate signal 125. For example, tail register 450, 460 may force a "0" to shift into head register 430, such that logic element 120 transitions from "HEAD" to "TAIL", then from "TAIL" to "WIRE", when intermediate signal 125 is "1" at Phases 3, 4, or 5. As shown in timing diagram 480, even though intermediate signal 125 is HIGH at Phase 5, output state signal 124 remains LOW due to the prevention of an uptake of intermediate signal 125. As a result of preventing an uptake of intermediate signal 125, output state signal 124 are HIGH, LOW, LOW, at Phase 3, Phase 5, and Phase, 7, respectively, such that the order of state changes for logic element 120 is "HEAD", "TAIL", "WIRE", which follows rules 142.

Figure 5:
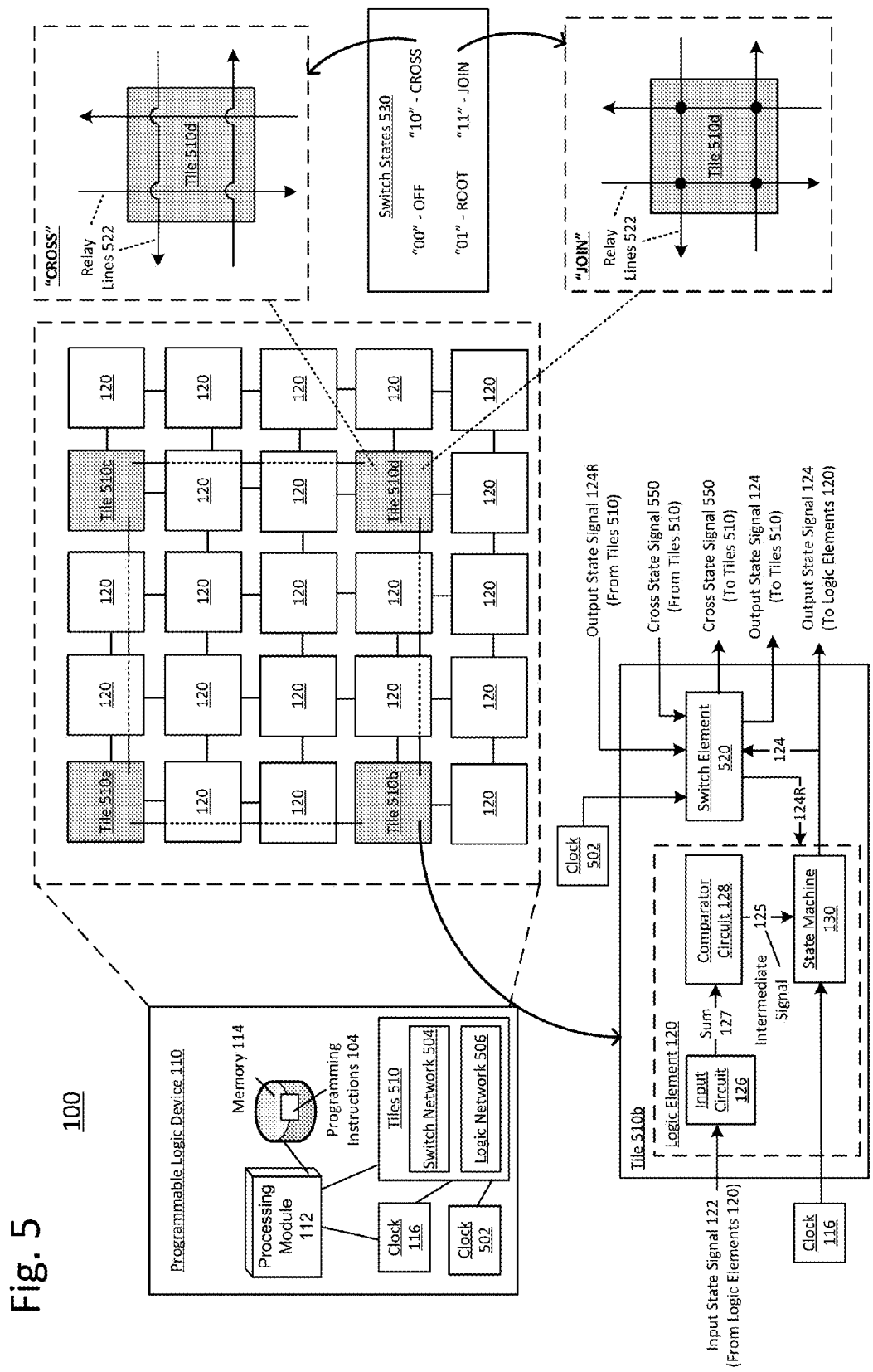
FIG. 5 illustrates example system of FIG. 1 with additional detail relating to a switch element.

FIG. 5 illustrates example system of FIG. 1 with additional detail relating to a switch element, arranged in accordance with at least some embodiments described herein. FIG. 5 is substantially similar to system 100 of FIG. 1, with additional details. Those components in FIG. 5 that are labeled identically to components of FIG. 1 will not be described again for the purposes of clarity.

In some examples, programmable logic device 110 may include one or more tiles 510 (including 510a, 510b, 510c, 510d), where each tile 510 may include one logic element 120 and one switch element 520. As will be described in more detail below, switch element 520 may include a circuit comprising one or more components such as AND gates, OR gates, inverters, registers, etc. Logic element 120 and switch element 520 in each tile 510 may be configured to be in communication with each other. In some examples, programming instructions 104 may include instructions to selectively activate or deactivate switch element 520 of tile 510. When switch element 520 is deactivated, tile 510 may operate as logic element 120. Each tile 510 may be configured to be in communication with one or more tile 510. In some examples, each tile 510 may be connected to four or more tiles 510, where the four or more connected tiles 510 may be connected in cardinal directions (e.g. east, west, north, south, north-east, south-east, north-west, south-west), such that tiles 510 may be connected to each other in a same row, column, or diagonally. For example, tile 510a may be connected to tile 510b in a same column, to tile 510c in a same row, and to tile 510d diagonally. Tiles 510 that are connected to each other, such as tiles 510a, 510b, 510c, 510d, may form a switch network 504 of programmable logic device 110. Similarly, logic elements 120 that are connected to each other may form a logic network 506 of programmable logic device 110.

Switch element 520 may be configured to operate under a clock 502, where clock 502 may be different from clock 116. Clock 502 may be a synchronous clock or an asynchronous clock. In some examples, programming instructions 104 may program clock 116 and clock 502 to operate with different clock cycles. In some examples, switch element 520 may be configured to transmit data across multiple tiles in one clock phase (described below).

Each switch element 520 of each tile 510 may be associated with a switch state 530. In some examples, each switch state 530 may be represented by a two-bit word, where the two-bit word may be stored or programmed into two registers within switch element 520 (described below). In the example shown in FIG. 5, there may be a finite number of switch states 530, such as "OFF", "ROOT", "CROSS", and "JOIN" switch states. Switch states 530 may be stored in two or more registers (the registers will be described in detail below). For example, switch states 530 such as "OFF", "ROOT, "CROSS", and "JOIN" may be represented by "00", "01", "10", "11", respectively, stored in the two or more registers. When switch state 530 of a particular switch element in a particular tile is "OFF", or "00", the particular tile may not be a part of switch network 504.

When switch state 530 of a particular switch element 520 of a particular tile 510 is "ROOT", or "01", the particular switch element 520 is activated, and the particular tile 510 may be configured to relay signals or data to and from the logic element 120 within the particular tile 510, and to and from any connected switch elements 520 that are not in "ROOT" switch state. When switch state 530 of a particular switch element 520 of a particular tile 510 is in "CROSS" switch state, or "10", the particular switch element 520 is activated, and the particular tile 510 may be configured to relay signals or data to and from switch elements 520 of tiles connected to the particular tile 510. When switch state 530 of a particular switch element 520 of a particular tile is "JOIN", or "11", the particular switch element 520 is activated, and the particular tile may be configured to operate as a combination of both "ROOT" and "CROSS" switch states, relaying signals or data to and from the logic element 120 within the particular tile, and to and from switch elements 520 of tiles connected to the particular tile 510.

When a particular switch element 520 has a CROSS register 610 value of "1", the particular switch element 520 may output a cross state signal 550 of "1" to neighboring switch elements. For example, if a particular switch element 520 is either in "CROSS" ("10") or "JOIN" ("11") switch state, switch element 520 may output cross state signal 550 of "1". Also, when a particular switch element 520 is in "ROOT" ("01") or "OFF" ("00") state, cross state signal 550 may be "0".

Each tile 510 may include one or more relay lines 522 to facilitate transmission of signals or data to and from tile 510. A switch element 520 in "CROSS" switch state may allow relay lines 522 to cross each other such that data may be transmitted across tile 510 without interfering with operations of logic element 120 in tile 510. For example, when tile 510d is in "CROSS" switch state, relay lines 522 of tile 510d may be arranged orthogonally with each other and may not be connected to each other, and data may be transmitted across tile 510d without the transmitted data being received at logic element 120 of tile 510d. Also, when tile 510d is in "CROSS" switch state, data transmitted across tile 510d may be transmitted to and from tiles 510 along an axis of relay lines 522 such that data is transmitted to tiles 510 in a same row and/or column as tile 510d. For example, tile 510d may transmit data to and from tiles 510b, 510c, but not tile 510a when tile 510d is in "CROSS" switch state.

A switch element 520 in "JOIN" switch state may allow relay lines 522 to split, join, or turn such that data may be transmitted to any switch element 520 in the switching network formed by tiles 510. For example, when tile 510d is in "JOIN" switch state, relay lines 522 of tile 510d may be joined with each other, turned to a direction orthogonal to an axis of relay lines 522, etc. When tile 510d is in "JOIN" switch state, tile 510d may transmit data to and from tiles 510a, 510b, 510c. In some examples, when tile 510d is in "JOIN" switch state, tile 510d may transmit data to logic element 120 within tile 510.

Focusing on tile 510b, switch element 520 may receive an output state signal 124R from a tile 510a that is connected to tile 510b. If switch state 530 of switch element 520 of tile 510b is "ROOT", and cross state signal 550 of tile 510a is "1", then switch element 520 may relay the signal as previously stated. If switch state 530 of switch element 520 of tile 510b is "CROSS" or "JOIN", the tile 510b disregards any cross state signal 550 it may receive from any tile 510 and relays the signal as previously mentioned.

Switch element 520 of tile 510b may be further configured to receive one or more cross state signals 550 from one or more tiles 510 connected to tile 510b. Cross state signals 550 may be effective to indicate whether a tile 510 has the "CROSS" register 610 enabled. For example, tile 510a may send cross state signal of a value "1" to tile 510b in order to notify tile 510b that tile 510a is not in "ROOT" state, and is therefore in "CROSS" or "JOIN" state, such that if tile 510b is in a "ROOT" state, tile 510b may relay signals to and from tile 510a. In another example, tile 510a may send cross state signal of a value "0" to tile 510b in order to notify tile 510b that tile 510a is in "ROOT" switch state, such that if tile 510b is in a "ROOT" state as well, tile 510b may not relay signals to and from tile 510a. Switch element 520 of tile 510b may be further configured to send cross state signal 550 to one or more tiles 510 connected to tile 510b.

Figure 6:
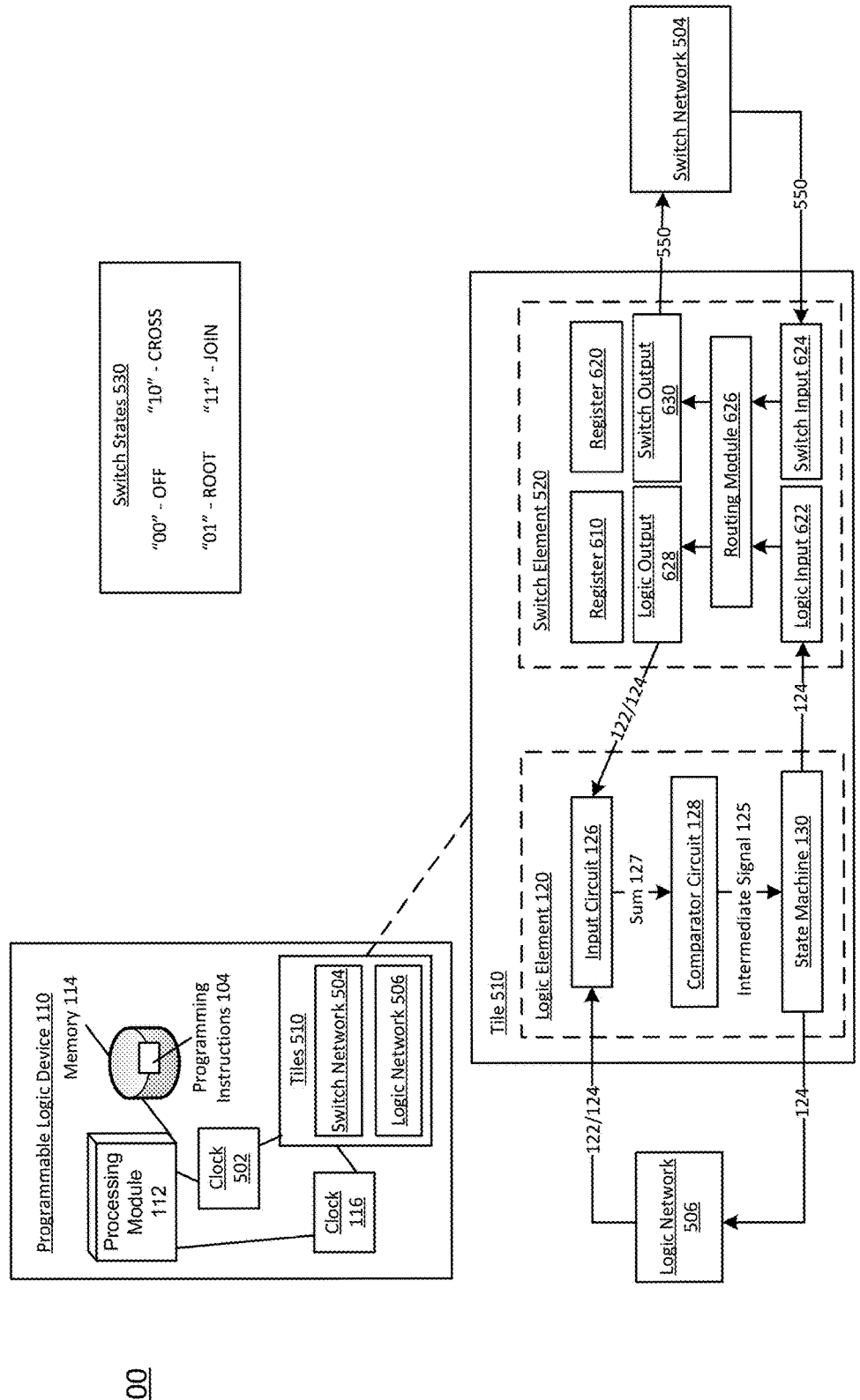
FIG. 6 illustrates example system of FIG. 1 with additional detail relating to components of a switch element.

FIG. 6 illustrates example system of FIG. 1 with additional detail relating to components of a switch element 520, arranged in accordance with at least some embodiments described herein. FIG. 6 is substantially similar to system 100 of FIG. 1, with additional details. Those components in FIG. 6 that are labeled identically to components of FIG. 1 will not be described again for the purposes of clarity.

In an example, switch element 520 may include one or more components such as AND gates, OR gates, inverters, registers, etc. In the example shown in FIG. 6, switch element 520 may include a register 610 and a register 612, where registers 610, 612 are the CROSS and ROOT registers respectively, configured to store values effective to represent switch state 530 of switch element 520. Register 610, 612 may each be a D-type flip-flop. In some examples, processing module 112 may program switch state 530 of switch element 520 by sending initial switch state signal 620 to registers 610, 612. In an example, programming instructions 104 may include instructions to define switch state 530 of switch element 520 to be "CROSS" switch state. Processing module 112 may send initial switch state signal 620 "10" to registers 610, 612, or may send "1" and "0" to registers 610, 612, respectively, in order to program switch state 530 of switch element 520.

Switch element 520 may further include logic output component 628 and switch output 630, each of which may include at least two AND gates and an inverter. Switch element 520 may further include logic input 622, switch input 624 and a routing module 626. Switch output component 630 and logic output component 628 may receive an initial switch state signal from registers 610, 612 and may output signals effective to define cross state signal 550. For example, if the initial switch state signal is [0,1], which indicates "ROOT" switch state, switch output components 630 and logic output component 628 may output signals effective to define cross state signal 550 to be "0". In another example, if initial switch state signal is [1,0], which indicates "CROSS" switch state, or the switch state signal 620 is [1,1], which indicates "JOIN", switch output component 630 may output signals effective to define cross state signal 550 to be "1".

As mentioned above, when switch element 520 of tile 510b is in "ROOT" switch state, switch element 520 may send output state signal 124R received from another tile 510 to logic element 120 of tile 510b. An output of switch element 520 may be connected to logic element 120.

Figure 7:
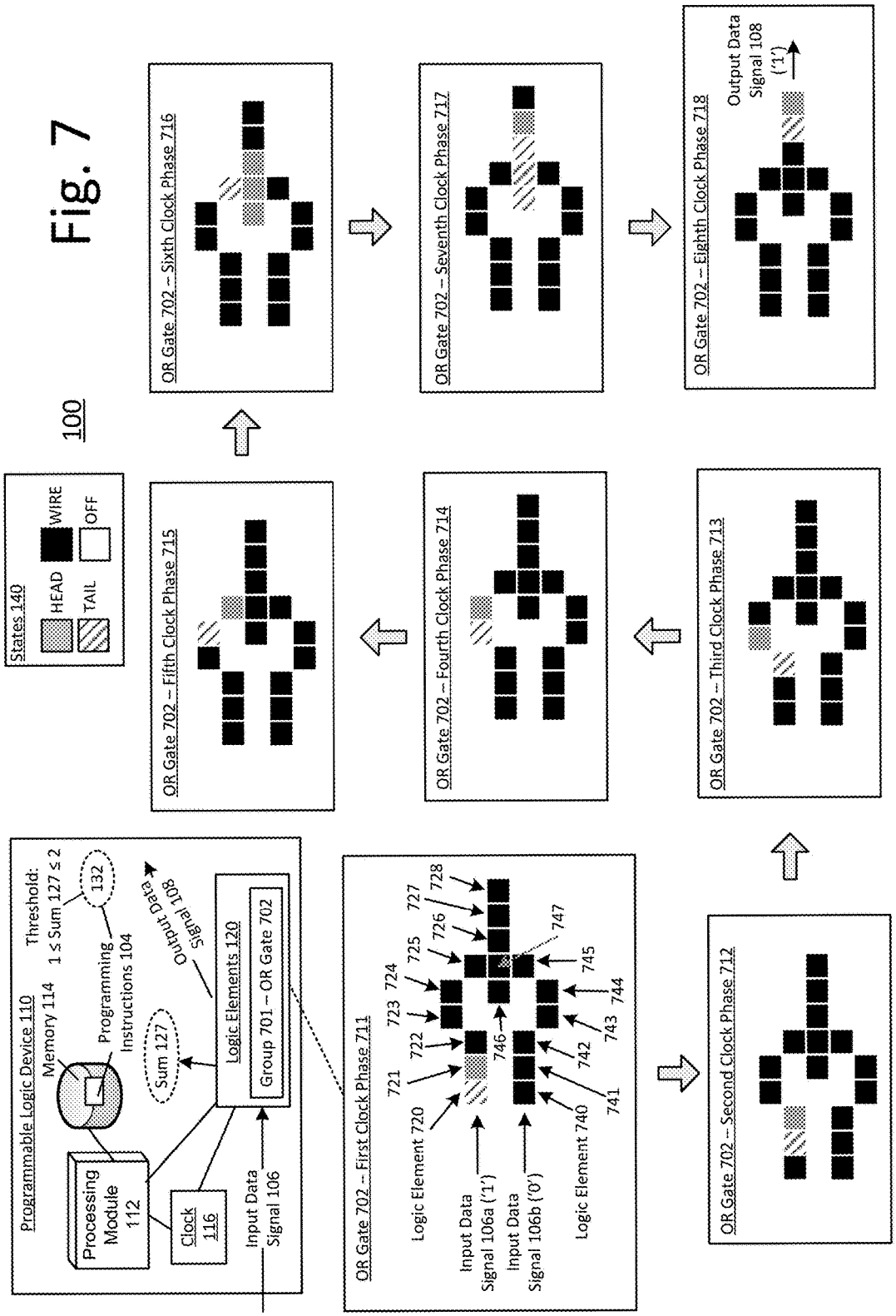
FIG. 7 illustrates example system of FIG. 1 with additional detail relating to an implementation of a group of logic elements.

FIG. 7 illustrates example system of FIG. 1 with additional detail relating to an implementation of a group of logic elements, arranged in accordance with at least some embodiments described herein. FIG. 7 is substantially similar to system 100 of FIG. 1, with additional details. Those components in FIG. 7 that are labeled identically to components of FIG. 1 will not be described again for the purposes of clarity.

In an example shown in FIG. 7, a group of logic elements 120 (group 701) may be designated by programming instructions 104 to be implemented as a two input OR gate 702. Group 701 may include logic elements 720, 721, 722, 723, 724, 725, 726, 727, 728, 740, 741, 742, 743, 744, 745, 746, 747, etc. Input data signal 106 may include input data signals 106a, 106b, where input data signal 106a may be "1" and input data signal 106b may be "0".

At a first clock phase 711, input data signals 106a, 106b may be inputs to OR gate 702 formed by group 701. Input data signal 106a may be fed into group 701 through logic elements 720, 721. Since input data signal 106a is "1", logic element 720 may be in a "TAIL" state and logic element 721 may be in a "HEAD" state, in order to indicate a direction of input data signal 106a. Input data signal 106b may be fed into group 701 through logic element 740. Since signal 106b is "0", logic element 740 may be in a "WIRE" state to indicate there is no signal present.

At a second clock phase 712, a position of input data signal 106a may change from logic elements 720, 721 to logic elements 721, 722, respectively. According to rules 142 (shown in, for example, FIG. 1), logic element 720 may change from a "TAIL" state at clock phase 711 to a "WIRE" state at clock phase 712. Logic element 721 may change from a "HEAD" state at clock phase 711 to a "TAIL" state at clock phase 712. Logic element 722 may change from a "WIRE" state at clock phase 711 to a "HEAD" state at clock phase 712. In the example, logic element 722 may determine sum 127 to be "1" because input state signals 122 received at logic element 722 includes one output state signal 124 of a "HEAD" state (output state signal 124 from logic element 721). Therefore, logic element 722 may change from a "WIRE" state to a "HEAD" state according to rules 142 and comparison of sum 127 ("1") with value 132 ("1") and value 134 ("2").

At a third clock phase 713, the position of input data signal 106a may change from logic elements 721, 722 to logic elements 722, 723, respectively. According to rules 142, logic element 721 may change from a "TAIL" state at clock phase 712 to a "WIRE" state at clock phase 713. Logic element 722 may change from a "HEAD" state at clock phase 712 to a "TAIL" state at clock phase 713. Logic element 723 may change from a "WIRE" state at clock phase 712 to a "HEAD" state at clock phase 713 based on rules 142 and comparison of sum 127 ("1") with value 132 ("1") and value 134 ("2").

At a fourth clock phase 714, the position of input data signal 106a may change from logic elements 722, 723 to logic elements 723, 724, respectively. According to rules 142, logic element 722 may change from a "TAIL" state at clock phase 713 to a "WIRE" state at clock phase 714. Logic element 723 may change from a "HEAD" state at clock phase 713 to a "TAIL" state at clock phase 714. Logic element 724 may change from a "WIRE" state at clock phase 713 to a "HEAD" state at clock phase 714 based on rules 142 and comparison of sum 127 ("1") with value 132 ("1") and value 134 ("2").

At a fifth clock phase 715, the position of input data signal 106a may change from logic elements 723, 724 to logic elements 724, 725, respectively. According to rules 142, logic element 723 may change from a "TAIL" state at clock phase 714 to a "WIRE" state at clock phase 715. Logic element 724 may change from a "HEAD" state at clock phase 714 to a "TAIL" state at clock phase 715. Logic element 725 may change from a "WIRE" state at clock phase 714 to a "HEAD" state at clock phase 715 based on rules 142 and comparison of sum 127 ("1") with value 132 ("1") and value 134 ("2").

At a sixth clock phase 716, the position of input data signal 106a may change from logic elements 724, 725 to logic elements 725, 726, 746, 747. According to rules 142, logic element 724 may change from a "TAIL" state at clock phase 715 to a "WIRE" state at clock phase 716. Logic element 725 may change from a "HEAD" state at clock phase 715 to a "TAIL" state at clock phase 716. Logic element 746 may change from a "WIRE" state at clock phase 715 to a "HEAD" state at clock phase 716 because logic element 746 received one output state signal 124 in a "HEAD" state (from logic element 725). Logic element 747 may change from a "WIRE" state at clock phase 715 to a "HEAD" state at clock phase 716 because logic element 747 received one output state signal 124 in a "HEAD" state (from logic element 725). Logic elements 726, 746, 747 may each change from a "WIRE" state at clock phase 715 to a "HEAD" state at clock phase 716 based on rules 142 and comparison of sum 127 ("1") with value 132 ("1") and value 134 ("2").

At a seventh clock phase 717, the position of input data signal 106a may change from logic elements 725, 726, 746, 747 to logic elements 726, 727, 746, 747. According to rules 142, logic element 725 may change from a "TAIL" state at clock phase 716 to a "WIRE" state at clock phase 717. Logic element 726 may change from a "HEAD" state at clock phase 716 to a "TAIL" state at clock phase 717. Logic element 746 may change from a "HEAD" state at clock phase 716 to a "TAIL" state at clock phase 717 based on rules 142. Logic element 747 may change from a "HEAD" state at clock phase 716 to a "TAIL" state at clock phase 717 based on rules 142. Logic element 727 may change from a "WIRE" state at clock phase 716 to a "HEAD" state at clock phase 717 because logic element 727 received one output state signal 124 in a "HEAD" state (from logic element 726). Logic element 727 may each change from a "WIRE" state at clock phase 716 to a "HEAD" state at clock phase 717 based on rules 142 and comparison of sum 127 ("1") with value 132 ("1") and value 134 ("2"). Further, logic element 745 may remain as "WIRE" state at clock phase 716 based on rules 142 and comparison of sum 127 ("3") with value 132 ("1") and value 134 ("2").

At a eighth clock phase 717, the position of input data signal 106a may change from logic elements 726, 727, 746, 747 to logic elements 727, 728. According to rules 142, logic element 746 may change from a "TAIL" state at clock phase 717 to a "WIRE" state at clock phase 718. Logic element 747 may change from a "TAIL" state at clock phase 717 to a "WIRE" state at clock phase 718. Logic element 726 may change from a "TAIL" state at clock phase 717 to a "WIRE" state at clock phase 718. Logic element 727 may change from a "HEAD" state at clock phase 717 to a "TAIL" state at clock phase 718. Logic element 728 may change from a "WIRE" state at clock phase 717 to a "HEAD" state at clock phase 718 because logic element 728 received one output state signal 124 in a "HEAD" state (from logic element 727). Logic element 728 may each change from a "WIRE" state at clock phase 717 to a "HEAD" state at clock phase 718 based on rules 142 and comparison of sum 127 ("1") with value 132 ("1") and value 134 ("2").

Since signal 106b is "0", no voltage or signal may be transmitted from logic element 740 to logic element 728. As a result of propagating signal 106a through group 701, group 701 may generate output data signal 108 of "1". As shown in the example in FIG. 7, group 701 may be implemented as a two input OR gate 702 to perform an OR operation on input data signal 106a ("1") and input data signal 106b ("0"), to generate an output of output data signal 108 ("1"), and to prevent signal back-flow to input elements 720 and 740.

Figure 8:
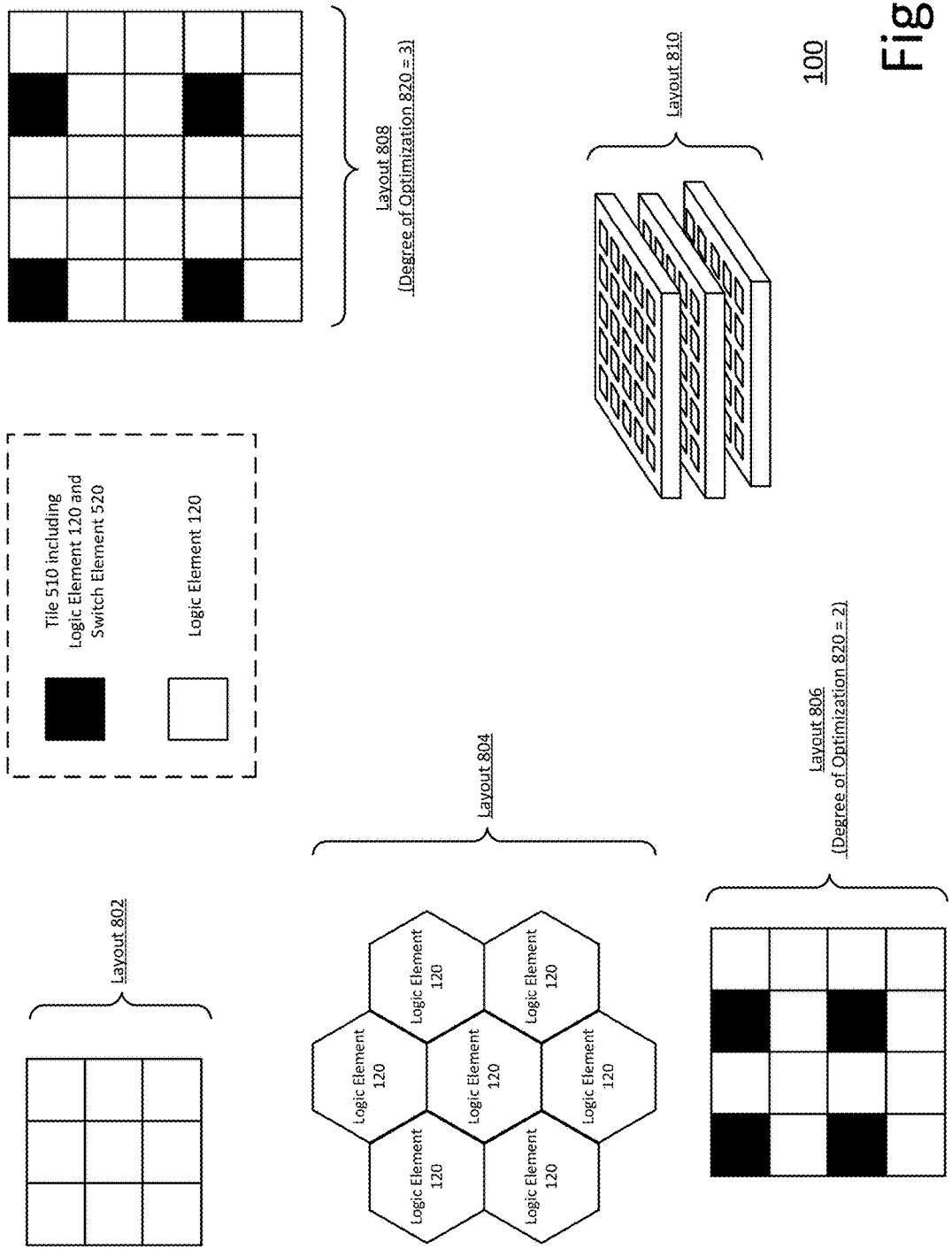
FIG. 8 illustrates example system of FIG. 1 with additional detail relating to layouts of logic elements and switch elements.

FIG. 8 illustrates example system 100 of FIG. 1 with additional detail relating to layouts of logic elements and switch elements, arranged in accordance with at least some embodiments described herein. FIG. 8 is substantially similar to system 100 of FIG. 1, with additional details. Those components in FIG. 8 that are labeled identically to components of FIG. 1 will not be described again for the purposes of clarity.

As shown in examples from FIGS. 1-7, logic elements 120 may be arranged in a two-dimensional array or matrix, as shown by a layout 802, such that each logic element 120 may be configured to be in communication with eight neighbor logic elements 120.

In another example, logic elements 120 may be arranged in a layout 804, where layout 804 may be a two-dimensional hexagonal arrangement. In layout 804, each logic element 120 may be configured to be in communication with six neighbor logic elements 120. A noise sensitivity of layout 804 may be less than a noise sensitivity of layout 802 based on a reduced number of neighbor logic elements for each logic element 120.

In another example, a number of tiles 510 including logic element 120 and switch element 520 may be based on a degree of optimization 820. In some examples, degree of optimization 820 may be defined by programming instructions 104 (shown in FIG. 1). When degree of optimization 820 is "2", a ratio of a number logic elements 120 to the number of switch elements 520 may be "$2^2$:1" or "4:1" such that a switch element 520 is present for every four logic elements 120, as shown by a layout 806. When degree of optimization 820 is "3", a ratio of a number of tiles 510 to logic elements 120 may be "9:1" such that a tile 510 is present for every nine logic elements 120, as shown by a layout 808. In an example, a degree of optimization 820 of "5" may provide an optimal spatial efficiency in a design of programmable logic device 110.

In another example, more than one layers of two-dimensional array or matrix including logic elements 120 may be arranged in a three-dimensional layout, such as a layout 810. In layout 810, each logic element 120 may be configured to be in communication with up to twenty-six neighbor logic elements. In some examples, layout 810 may include one or more tiles 510 that includes switch element 520. In some examples, the logic elements 120 may remain connected to 8 neighbors in a 2D plane, and only the switch element 520 may be connected to elements in other planes.

A system in accordance with the present disclosure may benefit circuit design in digital electronic systems. A system in accordance with the present disclosure may provide a matrix of logic elements in a programmable logic device without using lookup tables. By excluding lookup tables, a number of components, such as storage elements, of a logic element in programmable devices may be reduced. By reducing the number of components in a logic element, a size of logic elements may be reduced and component density of the programmable logic device may be improved. Further, the system in accordance with the present disclosure presents logic elements configured to relay signals based on a rule set, instead of relying on programming logic operations into individual logic elements.

Figure 9:
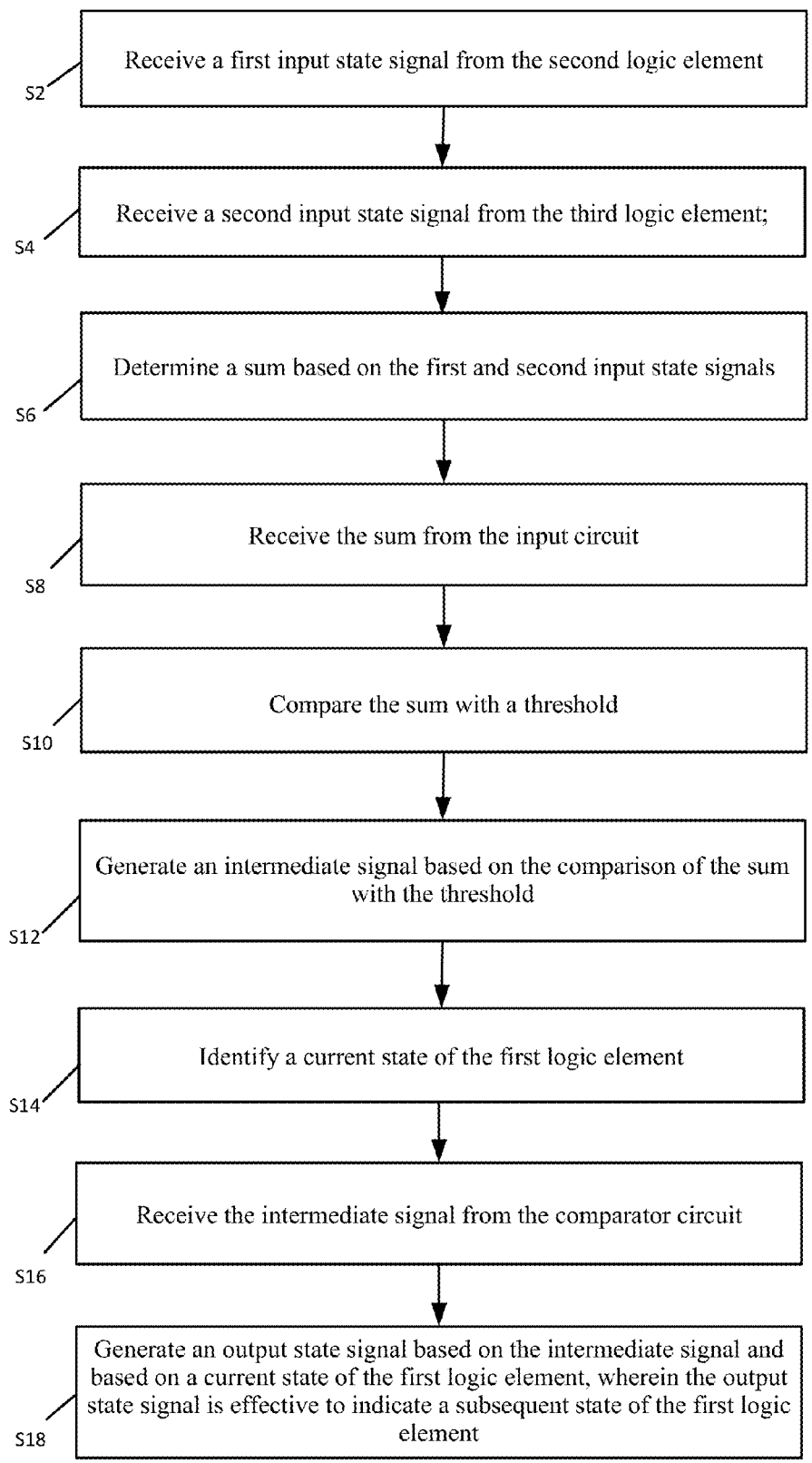
FIG. 9 illustrates a flow diagram for an example process to implement a programmable logic device, all arranged according to at least some embodiments described herein.

FIG. 9 illustrates a flow diagram for an example process to implement a programmable logic device, arranged in accordance with at least some embodiments presented herein. The process in FIG. 8 could be implemented using, for example, system 100 discussed above. An example process may include one or more operations, actions, or functions as illustrated by one or more of blocks S2, S4, S6, S8, S10, and/or S12. Although illustrated as discrete blocks, various blocks may be divided into additional blocks, combined into fewer blocks, or eliminated, depending on the desired implementation.

Processing may begin at block S2, "Receive a first input state signal from the second logic element". At block S2, a first input circuit of a first logic element that is part of an array that includes at least the first logic element, a second logic element, and a third logic element may receive a first input signal for the second logic element. The first logic element, the second logic element, and the third logic element may be configured to be in communication with each other. The array may be effective to generate an output state signal.

Processing may continue from block S2 to block S4, "Receive a second input state signal from the third logic element". At block S4, the input circuit may receive a second input state signal from the third logic element.

Processing may continue from block S4 to block S6, "Determine a sum based on the first and second input state signals". At block S6, the input circuit may determine a sum based on the first and second input state signals.

Processing may continue from block S6 to block S8, "Receive the sum from the input circuit". At block S8, a comparator circuit configured to be in communication with the input circuit may receive the sum from the input circuit.

Processing may continue from block S8 to block S10, "Compare the sum with a threshold". At block S10, the comparator circuit may compare the sum with a threshold.

Processing may continue from block S10 to block S12, "Generate an intermediate signal based on the comparison of the sum with the threshold". At block S12, the comparator circuit may generate an intermediate signal based on the comparison of the sum with the threshold.

Processing may continue from block S12 to block S14, "Identify a current state of the first logic element". At block S14, a state machine configured to be in communication with the comparator circuit the comparator circuit may identify a current state of the first logic element.

Processing may continue from block S14 to block S16, "Receive the intermediate signal from the comparator circuit". At block S16, the state machine may receive the intermediate signal from the comparator circuit.

Processing may continue from block S16 to block S18, "Generate an output state signal based on the intermediate signal and based on a current state of the first logic element, wherein the output state signal is effective to indicate a subsequent state of the first logic element". At block S88, the state machine may generate an output state signal based on the intermediate signal and based on a current state of the first logic element. The output state signal may be effective to indicate a subsequent state of the first logic element.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A first logic element in an array effective to generate an output state signal, wherein the array includes at least the first logic element, a second logic element configured to be in communication with the first logic element, a third logic element configured to be in communication with the first logic element, a first switching element to be in communication with the first logic element, and a second switching element to be in communication with the first switching element, the first logic element comprising:
   an input circuit configured to:
     receive a first input state signal from the second logic element;
     receive a second input state signal from the third logic element;
     receive a third input state signal from the first switching element;
     determine a sum based on the first, second, and third input state signals;
   a comparator circuit configured to be in communication with the input circuit, the comparator circuit being configured to:
     receive the sum from the input circuit;
     compare the sum with a threshold;
     generate an intermediate signal based on the comparison of the sum with the threshold;
   a state machine configured to be in communication with the comparator circuit, the state machine being configured to:

identify a current state of the first logic element;
receive the intermediate signal from the comparator circuit;
generate an output state signal based on the intermediate signal and based on a current state of the first logic element, wherein the output state signal is effective to indicate a subsequent state of the first logic element; and
a first switch circuit configured to be in communication with the state machine and the first switch element, the first switch element being configured to:
send and receive the output state signal to and from the first switch circuit;
receive a switch state signal from the second switch element, wherein the switch state signal is effective to indicate that the second switch element is permitted to accept the output state signal; and
in response to receipt of the switch state signal, send the output state signal to the second switch element, and in response to receipt of the output state signal from the second switch element, send the output state signal to the first switch circuit.

2. The first logic element of claim 1, wherein the state machine is further configured to:
receive an initial state signal, wherein the initial state signal is effective to indicate an initial state of the first logic element; and
store the initial state in a register.

3. The first logic element of claim 1, wherein the comparison of the sum with the threshold includes:
a determination of whether the sum is greater than or equal to a first value; and
a determination of whether the sum is less than or equal to a second value.

4. The first logic element of claim 1, wherein the state machine includes at least a first register and a second register configured to be in communication with each other, the state machine being configured to:
store the current state of the first logic element in the first register prior to receipt of the intermediate signal;
store the subsequent state of the first logic element in the first register in response to receipt of the intermediate signal;
store the subsequent state of the first logic element in the second register; and
determine whether to transmit the output state signal based on the subsequent state of the first logic element stored in the second register.

5. The first logic element of claim 1, wherein the state machine is further configured to send the output state signal to the second and third logic elements.

6. The first logic element of claim 1, further comprising a first clock and a second clock, wherein the state machine is configured to operate based on the first clock, and the first switch circuit is configured to operate based on the second clock.

7. The first logic element of claim 1, wherein the switch state signal is a first switch state signal, and the first switch circuit of the first logic element is further configured to send a second switch state signal to the second switch circuit of the third logic element.

8. An array comprising:
at least a first logic element, a second logic element, and third logic element configured to be in communication with each other;
at a first clock phase, the first logic element being configured to:
receive a first input state signal from the second logic element;
receive a second input state signal from the third logic element;
determine a first sum based on the first and second input state signals;
compare the first sum with a threshold; and
generate a first output state signal based on the comparison of the first sum with the threshold, and based on a current state of the first logic element, wherein the first output state signal is effective to indicate a subsequent state of the first logic element; and
send the first output state signal to the second logic element and to the third logic element;
at a second clock phase, the second logic element being configured to:
receive the first output state signal from the first logic element;
receive a third input state signal from the third logic element;
determine a second sum based on the first output state signal and based on the third input state signal;
compare the second sum with the threshold; and
generate a second output state signal based on the comparison of the second sum with the threshold, and based on a current state of the second logic element, wherein the second output state signal is effective to indicate a subsequent state of the second logic element; and
send the second output state signal to the first logic element and to the third logic element;
at a third clock phase, the third logic element being configured to:
receive a fourth input state signal from the first logic element;
receive the second output state signal from the second logic element;
determine a third sum based on the fourth input state signal and based on the second output state signal;
compare the third sum with a threshold; and
generate a third output state signal based on the comparison of the third sum with the threshold, and based on a current state of the third logic element, wherein the third output state signal is effective to indicate a subsequent state of the third logic element; and
send the third output state signal to the first logic element and to the second logic element.

9. The array of claim 8, wherein the third logic element is further configured to, at the second clock phase:
receive the first output state signal from the first logic element;
receive a fifth input state signal from the second logic element;
determine a fourth sum based on the first output state signal and based on the fifth input state signal;
compare the fourth sum with a threshold; and
generate a fourth output state signal based on the comparison of the fourth sum with the threshold, and based on the current state of the third logic element, wherein the fourth output state signal is effective to indicate a subsequent state of the third logic element; and
send the fourth output state signal to the first logic element and to the second logic element.

10. The array of claim 8, wherein the comparison of the first sum with the threshold includes:

a determination of whether the first sum is greater than or equal to a first value; and a determination of whether the first sum is less than or equal to a second value.

11. The array of claim 8, wherein the first logic element includes at least a first capacitor and a second capacitor, the first capacitor being configured to be in communication with the second logic element, the second capacitor being configured to be in communication with the third logic element, and wherein:

the first capacitor is effective to store a first amount of energy in response to receipt of the first input state signal; and the second capacitor is effective to store a second amount of energy in response to receipt of the second input state signal, wherein the first sum is a combination of the first and second amounts of energy.

12. The array of claim 8, wherein the first logic element includes at least a first register and a second register configured to be in communication with each other, the first logic element is further configured to:

store the current state of the first logic element in the first register;

store the subsequent state of the first logic element in the first register in response to the comparison of the first sum with the threshold;

store the subsequent state of the first logic element in the second register; and determine whether to transmit the first output state signal to the second and third logic elements based on the subsequent state of the first logic element stored in the second register.

13. The array of claim 8, wherein the first logic element is further configured to:

receive an initial state signal, wherein the initial state signal is effective to indicate an initial state of the first logic element; and store the initial state in a register.

14. A method for generating an output state signal in an array, wherein the array includes at least a first logic element, a second logic element configured to be in communication with the first logic element, and a third logic element configured to be in communication with the first logic element, the method comprising:

receiving, by the first logic element at a first clock phase, a first input state signal from the second logic element;

receiving, by the first logic element at the first clock phase, a second input state signal from the third logic element;

determining, by the first logic element at the first clock phase, a first sum based on the first and second input state signals;

comparing, by the first logic element at the first clock phase, the first sum with a threshold;

generating, by the first logic element at the first clock phase, a first output state signal based on the comparison of the first sum with the threshold, and based on a current state of the first logic element, wherein the first output state signal is effective to indicate a subsequent state of the first logic element;

sending, by the first logic element at the first clock phase, the first output state signal to the second logic element and to the third logic element;

receiving, by the second logic element at a second clock phase, the first output state signal from the first logic element;

receiving, by the second logic element at the second clock phase, a third input state signal from the third logic element;

determining, by the second logic element at the second clock phase, a second sum based on the first output state signal and based on the third input state signal;

comparing, by the second logic element at the second clock phase, the second sum with a threshold; and generating, by the second logic element at the second clock phase, a second output state signal based on the comparison of the second sum with the threshold, and based on a current state of the second logic element, wherein the second output state signal is effective to indicate a subsequent state of the second logic element; and sending, by the second logic element at the second clock phase, the second output state signal to the first logic element and to the third logic element;

receiving, by the third logic element at a third clock phase, a fourth input state signal from the first logic element;

receiving, by the third logic element at the third clock phase, the second output state signal from the second logic element;

determining, by the third logic element at the third clock phase, a third sum based on the fourth input state signal and based on the second output state signal;

comparing, by the third logic element at the third clock phase, the third sum with a threshold; and generating, by the third logic element at the third clock phase, a third output state signal based on the comparison of the third sum with the threshold, and based on a current state of the third logic element, wherein the third output state signal is effective to indicate a subsequent state of the third logic element; and sending, by the third logic element at the third clock phase, the third output state signal to the first logic element and to the second logic element.

15. The method of claim 14, further comprising, prior to receiving the first and second input state signals:

receiving, by the first logic element, an initial state signal, wherein the initial state signal is effective to indicate an initial state of the first logic element; and storing the initial state in a register.

16. The method of claim 14, wherein the comparing the first sum with the threshold includes:

determining, by the first logic element, whether the sum is greater than or equal to a first value; and determining, by the first logic element, whether the sum is less than or equal to a second value.

17. The method of claim 14, further comprising:

storing the current state of the first logic element in a first register;

storing the subsequent state of the first logic element in the first register in response to comparing the first sum with the threshold;

storing the subsequent state of the first logic element in the second register; and determining whether to send the first output state signal to the second and third logic elements based on the subsequent state of the first logic element stored in the second register.

18. The method of claim 14, further comprising:

in response to receiving the first input state signal, storing a first amount of energy in a first capacitor; and in response to receiving the first input state signal, storing a second amount of energy in a second capacitor, wherein the sum is a combination of the first and second amounts of energy.

* * * * *